(12) United States Patent
Akita

(10) Patent No.: US 6,373,303 B2
(45) Date of Patent: Apr. 16, 2002

(54) SYNC SIGNAL GENERATING CIRCUIT PROVIDED IN SEMICONDUCTOR INTEGRATED CIRCUIT

(75) Inventor: Hironobu Akita, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/846,286

(22) Filed: May 2, 2001

(30) Foreign Application Priority Data

May 22, 2000 (JP) .......................................... 12-150254

(51) Int. Cl.$^7$ ................................................ H03L 7/06
(52) U.S. Cl. ...................... 327/156; 327/158; 327/270; 327/276; 327/393
(58) Field of Search .................... 327/141, 144–147, 327/149, 150, 156, 158, 159, 269, 270, 276, 77, 78, 392, 393, 398, 403

(56) References Cited

U.S. PATENT DOCUMENTS 5,550,514 A * 8/1996 Liedberg ..................... 331/1 A
6,052,011 A * 4/2000 Dasgupta ..................... 327/270

FOREIGN PATENT DOCUMENTS

JP 2001-51745 2/2001

OTHER PUBLICATIONS

Shim et al., An Analog Synchronous Mirror Delay for High–Speed DRAM Application, IEEE Journal of Solid–State Circuits, vol. 34, No. 4, Apr., 1999.

Lee et al., "A 2.5–V, 333–Mb/s/pin, 1–Gbit, Double–Data–Rate Synchronous DRAM", IEEE Journal of Solid–State Circuits, vol. 34, No. 11, Nov., 1999.

Nakase et al., "Source–Synchronization and Timing Vernier Techniques for 1.2–GB/s SLDRAM Interface", IEEE Journal of Solid–State Circuits, vol. 34, No. 4, Apr., 1999.

Akita et al., "A Novel Analog Mirror Type DLL suitable for Low Voltage Operation with Self–Calibration Method", The Second IEEE Asia Pacific Conference on ASICs, Aug. 28–30, 2000.

* cited by examiner

*Primary Examiner*—Kenneth B. Wells
*Assistant Examiner*—An T. Luu
(74) *Attorney, Agent, or Firm*—Banner & Witcoff, Ltd.

(57) ABSTRACT

A sync signal generating circuit has a first I/O replica for delaying an external clock signal, a comparator replica with a variable delay time for delaying an output of the first I/O replica, a first ramp-voltage generating circuit for outputting a first voltage whose potential level begins to rise at a time of transition of a level of the output of the comparator replica and stops rising at a predetermined timing, a second ramp-voltage generating circuit for outputting a second voltage whose potential level begins to rise after the rising of the potential level of the first voltage stops, a voltage comparator for comparing the first and second voltages and outputting an internal clock signal, a second I/O replica for delaying the internal clock signal with a delay time substantially equal to the delay time of the first I/O replica, and a phase comparator for comparing a phase of an output of the second I/O replica and a phase of an input to the first I/O replica. A delay time in the comparator replica is adjusted on the basis of an output from the phase comparator.

30 Claims, 12 Drawing Sheets

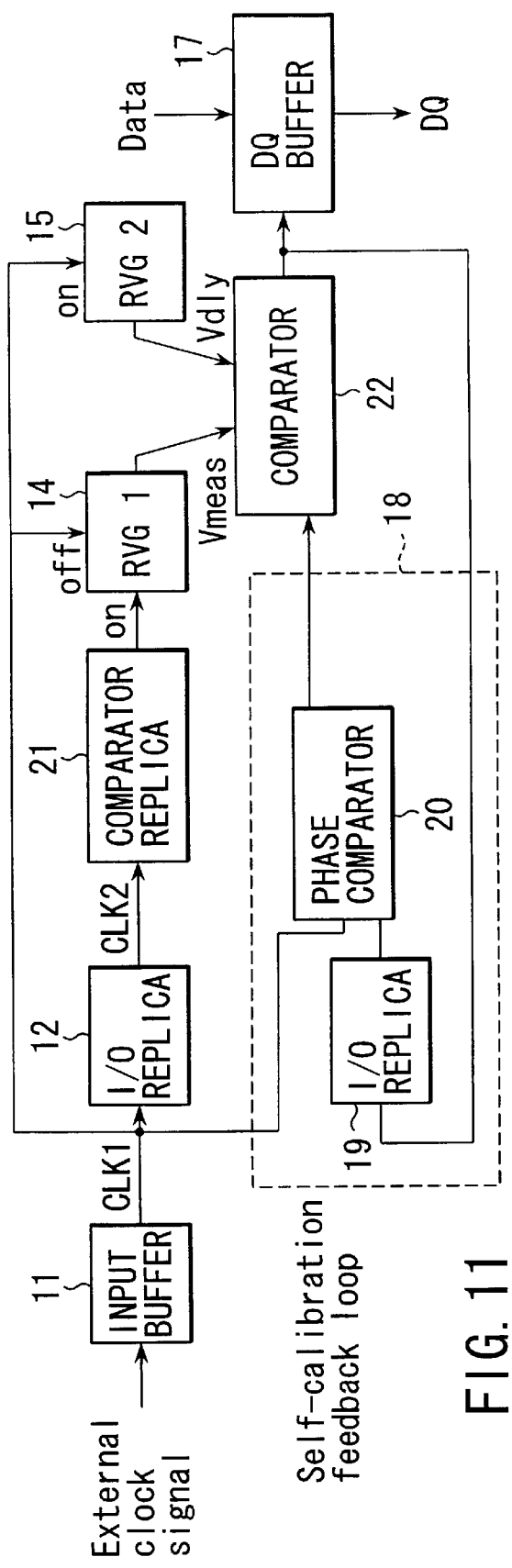
FIG. 11
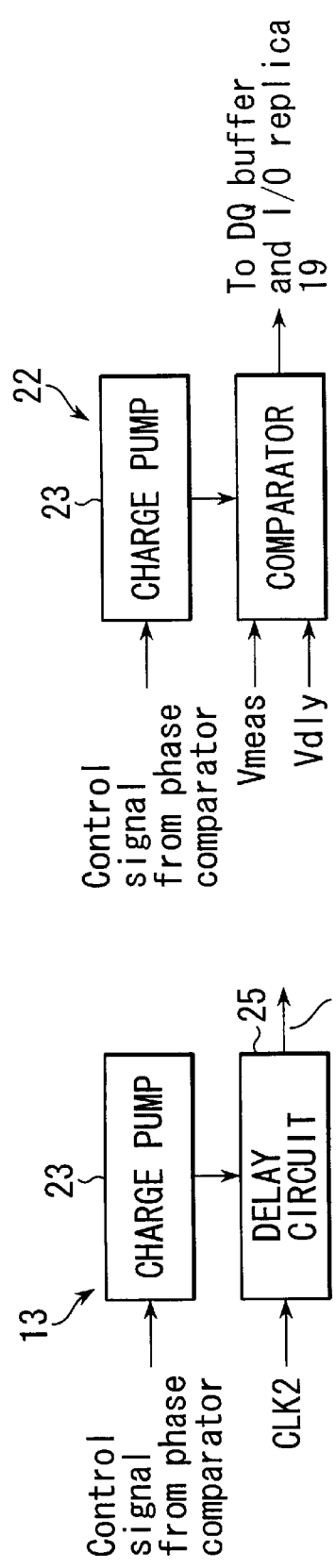
FIG. 12B
FIG. 12A

SYNC SIGNAL GENERATING CIRCUIT PROVIDED IN SEMICONDUCTOR INTEGRATED CIRCUIT

CROSS-REFERENCE TO RELATED APPLICATIONS

This application is based upon and claims the benefit of priority from the prior Japanese Patent Application No. 2000-150254, filed May 22, 2000, the entire contents of which are incorporated herein by reference.

BACKGROUND OF THE INVENTION

The present invention relates to a sync signal generating circuit provided in a semiconductor integrated circuit such as a synchronous DRAM. More particularly, this invention relates to a sync signal generating circuit for generating an internal clock signal from an external clock signal, which internal clock signal is synchronized with the external clock signal.

In modern semiconductor integrated circuits, there is a demand for a higher input/output operation speed in an I/O section (data input/output section). In order to make the phase of data agree with that of a system clock signal, a PLL (Phase Locked Loop) or a DLL (Delay Locked Loop) is used. Among DLLs, a mirror-type DLL is more advantageous than a feedback-type DLL since the former has a high synchronization speed.

In particular, in an ASMD (Analog Synchronous Mirror Delay) disclosed in the Journal of Solid-State Circuit, Vol. 34, No. 4, April, 1999, "An Analog Synchronous Mirror Delay for High-Speed DRAM Application", or an analog-operable mirror-type DLL disclosed in Japanese Patent Application No. 11-228710, no such quantization error, as occurs in a digital-operable mirror-type DLL, will occur and high-precision operational characteristics can be obtained.

FIG. 1 shows an example of a conventional analog-operable mirror-type DLL. The DLL comprises an input buffer 51, an I/O replica 52, a comparator replica 53, two ramp-voltage generating circuits (RVG1, RVG2) 54 and 55, a comparator 56, and a DQ buffer 57.

The input buffer 51 receives an external clock signal and outputs a clock signal CLK1 obtained by delaying the external clock signal. The I/O replica 52 receives the clock signal CLK1 and outputs a clock signal CLK2, which is obtained by delaying the clock signal CLK1 by a delay time substantially equal to a sum of a delay time in the input buffer 51 and a delay time in the DQ buffer 57 from a time point of change of an internal clock signal to a time point of outputting of DQ. The comparator replica 53 receives the clock signal CLK2 and outputs a clock signal obtained by delaying the clock signal CLK2 by a delay time substantially equal to a delay time in the comparator 56.

The ramp-voltage generating circuit, RVG1 54, receives the clock signal from the comparator replica 53 and the clock signal CLK1 and outputs a ramp voltage (analog voltage) Vmeans. The potential level of the ramp voltage Vmeans rises at a constant gradient in synchronism with the rising of the clock signal from the comparator replica 53, and the rising of this potential level stops in synchronism with the rising of the clock signal CLK1.

The ramp-voltage generating circuit, RVG2 55, receives the clock signal CLK1 and outputs a ramp voltage (analog voltage) Vdly, whose potential level rises at a constant gradient in synchronism with the rising of the clock signal CLK1. Assume that the gradients of the rising of the output voltages Vmeans and Vdly in both ramp-voltage generating circuits 54 and 55 are equal.

The comparator 56 compares both voltages Vmeans and Vdly and produces an internal clock signal on the basis of the comparison result. The DQ buffer 57 receives internal data and the internal clock signal, takes in the internal data in synchronism with the internal clock signal, and outputs the data as data DQ to the outside.

FIG. 2 is a signal waveform diagram illustrating an example of the operation of the DLL shown in FIG. 1.

If the external clock signal is supplied, the clock signal CLK1 rises with a delay tIB (input buffer delay: a delay time in the input buffer 51) relative to the external clock signal. Then, the clock signal CLK2 rises with a delay tREP (=tIB+tOB: tOB is a delay time in the DQ buffer 57) relative to the clock signal CLK1. After a delay time in the comparator replica 53 from the rising of the clock signal CLK2, the output clock signal of the comparator replica 53 rises and the output voltage Vmeans in the ramp-voltage generating circuit 54 begins to rise.

If a second-cycle external clock signal rises after the lapse of a first cycle time tCLK of the external clock signal, and a second-cycle clock signal CLK1 rises, the rising of the output voltage Vmeans of the ramp-voltage generating circuit 54 stops and, in turn, the output voltage Vdly of the other ramp-voltage generating circuit 55 begins to rise. The voltages Vdly and Vmeans are compared and, when both voltages have coincided, the internal clock signal rises. The data DQ is output from the DQ buffer 57 with a delay tOB (DQ buffer delay) relative to the rising of the internal clock signal.

Since the output voltages Vmeans and Vdly of the two ramp-voltage generating circuits 54 and 55 rise at the same gradient, a time period tRAMP from when the output voltage Vmeans of the ramp voltage generating circuit 54 begins to rise to when the rising of the output voltage Vmeans stops in synchronism with the clock signal CLK1 is equal to a time period tRAMP from when the output voltage Vdly of the other ramp-voltage generating circuit 55 begins to rise to when the output voltage Vdly becomes equal to the output voltage Vmeans. In addition, the delay time of the comparator replica 53 is substantially equal to that of the comparator 56. Thus, assuming that each delay time is tCMP, a delay time ΔTOTAL of the data DQ relative to the external clock signal is given by $$\Delta \text{TOTAL} = tIB + tREP + tCMP + tRAMP + tRAMP + tCMP + tOB \quad (1)$$

Since tIB+tOB=tREP, it this is substited in equation (1), the following equation (2) is obtained:

$$\Delta \text{TOTAL} = 2(tREP + tCMP + tRAMP) \quad (2)$$

The time period tRAMP is given by the following equation (3), that is, by subtracting the sum of tIB, tREP and tCMP from the time period (tIB+tCLK) from the timing at which the first-cycle external clock signal rises to the timing at which the second-cycle clock signal CLK1 rises:

$$tRAMP = (tIB + tCLK) - (tIB + tREP + tCMP) \quad (3)$$

$$= tCLK - (tREP + tCMP)$$

If equation (3) is substituted in equation (2), equation (4) is obtained:

$$\Delta TOTAL = 2\{tREP + tCMP + tCLK - (tREP + tCMP)\} \quad (4)$$

$$= 2\,tCLK$$

In other words, the data DQ, synchronized with the external clock signal, is output from the third-cycle external clock signal.

The comparator 56 shown in FIG. 1 may be, for example, a dynamic-type comparator using a differential amplifier, a capacitor and inverters composed of NMOSFETs and PMOSFETs.

The comparator, such as a dynamic-type comparator using a differential amplifier, a capacitor and inverters, is an analog circuit. In general terms, there arises a variance in characteristics of an analog circuit due to a fabrication process, a voltage used and a temperature in operation (hereinafter referred to as "PVT" (i.e. Process, Voltage and Temperature)). In particular, if a digital-specific process is applied to circuit integration, a greater process variance will occur, compared to the case of using an analog-specific process. Such a PVT variance adversely affects, in particular, analog circuits and it causes a variance in characteristics.

FIG. 3 shows a delay time variation (ps) occurring when the threshold voltages (Vth) of the NMOSFETs and PMOSFETs of the dynamic-type comparator are higher ("High") or lower ("Low") than a specified value ("center") and when the temperature (Temp.(° C.)) varies in a range between −10° C. and 100° C. When both the threshold voltages (Vth) of the NMOSFETs and PMOSFETs of the dynamic-type comparator are higher than the specified value ("High/High"), the delay time greatly increases. On the other hand, when both the threshold voltages (Vth) of the NMOSFETs and PMOSFETs of the dynamic-type comparator are lower than the specified value ("Low/Low"), the delay time greatly decreases. In addition, the lower the temperature, the greater the delay time.

As described above, there is a PVT variance in the comparator 56 shown in FIG. 1, which is composed of an analog circuit, and the PVT variance varies the delay time tCMP of the comparator 56. Then, the phase of the internal clock signal output from the comparator 56 will be displaced. As a result, as shown in FIG. 4, the data window (i.e. a time period for data output) of the DQ buffer 57, which takes in data in synchronism with the internal clock signal, will be displaced and the output data DQ will not be synchronized with the external clock signal.

The amount of the delay time variation in the comparator is basically a variation amount which cannot be compensated. Even if a compensating circuit is to be fabricated, it is very difficult to compose such a circuit with a digital circuit structure.

BRIEF SUMMARY OF THE INVENTION

As has been described above, the conventional analog-operable mirror-type DLL is free of such a quantization error, as occurs in a digital-operable mirror-type DLL, and can possess high-precision operational characteristics. However, since the analog-operable mirror-type DLL is an analog circuit, the delay time thereof will vary due to a fabrication process, voltage used and temperature in operation, and high-precision sync characteristics cannot be obtained.

The present invention has been made in consideration of the above problem, and its object is to provide an analog-operable sync signal generating circuit which can have high-precision sync characteristics.

In order to achieve the object, according to an aspect of the invention, there is provided a sync signal generating circuit comprising: an input buffer circuit to which an external clock signal is input; a first delay circuit, connected to the input buffer circuit, for delaying an output of the input buffer circuit by a first time period and delivering a delayed output; a variable delay circuit, connected to the first delay circuit, for delaying the output of the first delay circuit and delivering a delayed output; a first voltage generating circuit, connected to the variable delay circuit and the input buffer circuit, for outputting a first analog voltage whose potential level begins to rise at a predetermined gradient at a time of transition of a level of the output of the variable delay circuit, and stops rising at a time of transition of a level of the output of the input buffer circuit; a second voltage generating circuit, connected to the input buffer circuit, for outputting a second analog voltage whose potential level begins to rise at a predetermined gradient at a time of transition of a level of the output of the input buffer circuit; a voltage comparing circuit, connected to the first and second voltage generating circuits, for comparing the first and second analog voltages and outputting an internal clock signal; an internal circuit connected to the voltage comparing circuit, an operation of the internal circuit being controlled in synchronism with the internal clock signal; a second delay circuit, connected to the voltage comparing circuit, for delaying the internal clock signal by a second time period that is substantially equal to the first time period, and delivering a delayed output; and a phase comparator, connected to the second delay circuit and the input buffer circuit, for comparing phases of outputs of the second delay circuit and the input buffer circuit, and outputting a control signal corresponding to a phase difference obtained by the comparison of the outputs, wherein a delay time in the variable delay circuit is adjusted on the basis of the control signal output from the phase comparator.

According to another aspect of the invention, there is provided a sync signal generating circuit comprising: an input buffer circuit to which an external clock signal is input; a first delay circuit, connected to the input buffer circuit, for delaying an output of the input buffer circuit by a first time period and delivering a delayed output; a variable delay circuit, connected to the first delay circuit, for delaying the output of the first delay circuit and delivering a delayed output; a first voltage generating circuit, connected to the variable delay circuit and the input buffer circuit, for outputting a first analog voltage whose potential level begins to rise at a predetermined gradient at a time of transition of a level of the output of the variable delay circuit, and stops rising at a time of transition of a level of the output of the input buffer circuit; a second voltage generating circuit, connected to the input buffer circuit, for outputting a second analog voltage whose potential level begins to rise at a predetermined gradient at a time of transition of a level of the output of the input buffer circuit; a voltage comparing circuit, connected to the first and second voltage generating circuits, for comparing the first and second analog voltages and outputting an internal clock signal; an internal circuit connected to the voltage comparing circuit, an operation of the internal circuit being controlled in synchronism with the internal clock signal; a first frequency-division circuit, connected to the voltage comparing circuit, for frequency-dividing the internal clock signal and delivering a frequency-division output; a second delay circuit, connected to the first frequency-division circuit, for delaying the output of the first frequency-division circuit by a second time period that is substantially equal to the first time period, and delivering a delayed output; a second frequency-division circuit, connected to the input buffer circuit, for frequency-dividing the output of the input buffer circuit and delivering a frequency-division output; and a phase comparator, connected to the second delay circuit, the second frequency-division circuit and the variable delay circuit, for comparing phases of outputs of the second delay circuit and the second frequency-division circuit, and outputting a control signal corresponding to a phase difference obtained by the comparison of the outputs to the variable delay circuit, wherein a delay time in the variable delay circuit is adjusted on the basis of the control signal output from the phase comparator.

According to still another aspect of the invention, there is provided a sync signal generating circuit comprising: an input buffer circuit to which an external clock signal is input; a first delay circuit, connected to the input buffer circuit, for delaying an output of the input buffer circuit by a first time period and delivering a delayed output; a second delay circuit, connected to the first delay circuit, for delaying the output of the first delay circuit by a second time period and delivering a delayed output; a first voltage generating circuit, connected to the second delay circuit and the input buffer circuit, for outputting a first analog voltage whose potential level begins to rise at a predetermined gradient at a time of transition of a level of the output of the second delay circuit, and stops rising at a time of transition of a level of the output of the input buffer circuit; a second voltage generating circuit, connected to the input buffer circuit, for outputting a second analog voltage whose potential level begins to rise at a predetermined gradient at a time of transition of a level of the output of the input buffer circuit; a voltage comparing/variable delay circuit, connected to the first and second voltage generating circuits, for comparing the first and second analog voltages, outputting an internal clock signal, delaying the internal clock signal, and delivering a delayed output; an internal circuit connected to the voltage comparing/variable delay circuit, an operation of the internal circuit being controlled in synchronism with the internal clock signal; a third delay circuit, connected to the voltage comparing/variable delay circuit, for delaying the internal clock signal by a time period that is substantially equal to the first time period, and delivering a delayed output; and a phase comparator, connected to the third delay circuit and the input buffer circuit, for comparing phases of outputs of the third delay circuit and the input buffer circuit, and outputting a control signal corresponding to a phase difference obtained by the comparison of the outputs, wherein a delay time in the voltage comparing/variable delay circuit is adjusted on the basis of the control signal corresponding to the phase difference, which is output from the phase comparator.

According to still another aspect of the invention, there is provided a sync signal generating circuit comprising: an input buffer circuit to which an external clock signal is input; a first delay circuit, connected to the input buffer circuit, for delaying an output of the input buffer circuit by a first time period and delivering a delayed output; a second delay circuit, connected to the first delay circuit, for delaying the output of the first delay circuit by a second time period and delivering a delayed output; a first voltage generating circuit, connected to the second delay circuit and the input buffer circuit, for outputting a first analog voltage whose potential level begins to rise at a predetermined gradient at a time of transition of a level of the output of the second delay circuit, and stops rising at a time of transition of a level of the output of the input buffer circuit; a second voltage generating circuit, connected to the input buffer circuit, for outputting a second analog voltage whose potential level begins to rise at a predetermined gradient at a time of transition of a level of the output of the input buffer circuit; a voltage comparing/variable delay circuit, connected to the first and second voltage generating circuits, for comparing the first and second analog voltages, outputting an internal clock signal, delaying the internal clock signal, and delivering a delayed output; an internal circuit connected to the voltage comparing/variable delay circuit, an operation of the internal circuit being controlled in synchronism with the internal clock signal; a first frequency-division circuit, connected to the voltage comparing/variable delay circuit, for frequency-dividing the internal clock signal and delivering a frequency-division output; a third delay circuit, connected to the first frequency-division circuit, for delaying the output of the first frequency-division circuit by a third time period that is substantially equal to the first time period, and delivering a delayed output; a second frequency-division circuit, connected to the input buffer circuit, for frequency-dividing the output of the input buffer circuit and delivering a frequency-division output; and a phase comparator, connected to the third delay circuit, the second frequency-division circuit and the voltage comparing/variable delay circuit, for comparing phases of outputs of the third delay circuit and the second frequency-division circuit, and outputting a control signal corresponding to a phase difference obtained by the comparison of the outputs to the voltage comparing/variable delay circuit, wherein a delay time in the voltage comparing/variable delay circuit is adjusted on the basis of the control signal output from the phase comparator.

According to still another aspect of the invention, there is provided a sync signal generating circuit comprising: an input buffer circuit to which an external clock signal is input; a first delay circuit, connected to the input buffer circuit, for delaying an output of the input buffer circuit by a first time period and delivering a delayed output; a second delay circuit, connected to the first delay circuit and the input buffer circuit, for starting delaying of the output of the first delay circuit at a time of transition of a level of the output of the first delay circuit and stopping the delaying of the output of the first delay circuit at a time of transition of a level of the output of the input buffer circuit; a third delay circuit, connected to the input buffer circuit, for starting delaying of the output of the input buffer circuit at a time of transition of a level of the output of the input buffer circuit, delaying the output of the input buffer circuit by a delay time substantially equal to a delay time in the second delay circuit, and outputting a delayed output; a variable delay circuit, connected to the third delay circuit, for delaying the output of the third delay circuit and outputting an internal clock signal; an internal circuit connected to the variable delay circuit, an operation of the internal circuit being controlled in synchronism with the internal clock signal; a fourth delay circuit, connected to the variable delay circuit, for delaying the internal clock signal by a time period that is substantially equal to the first time period, and delivering a delayed output; and a phase comparator, connected to the fourth delay circuit and the input buffer circuit, for comparing phases of outputs of the fourth delay circuit and the input buffer circuit, and outputting to the variable delay circuit a control signal corresponding to a phase difference obtained by the comparison of the outputs, wherein a delay time in the variable delay circuit is adjusted on the basis of the control signal output from the phase comparator.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a block diagram showing the structure of a mirror-type DLL according to a second embodiment of the present invention;

FIG. 12A shows a specific circuit example of a comparator replica in the DLL shown in FIG. 5;

FIG. 12B shows a specific circuit example of a voltage comparator in the DLL shown in FIG. 11;

DETAILED DESCRIPTION OF THE INVENTION

Embodiments of the present invention will now be described in detail with reference to the accompanying drawings.

Figure 5:
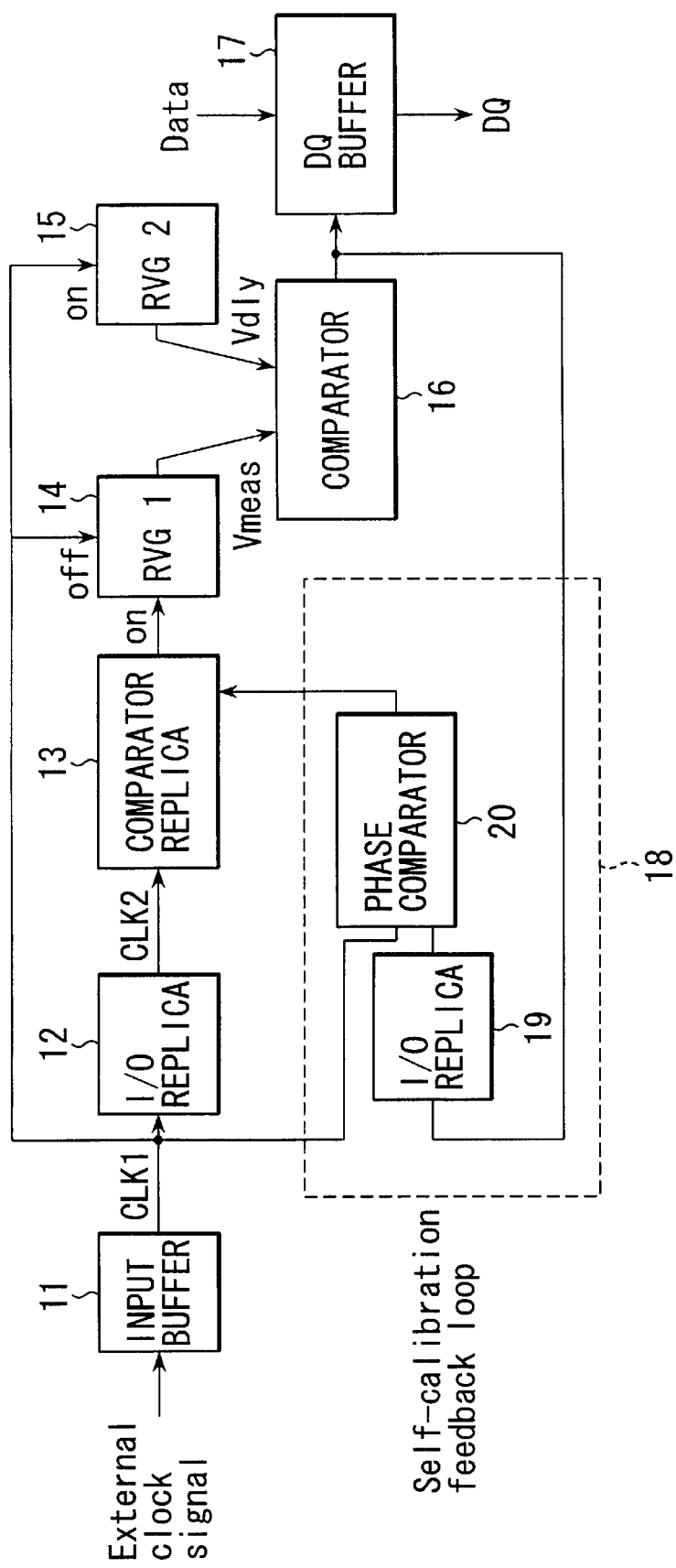
FIG. 5 is a block diagram showing the structure of a mirror-type DLL according to a first embodiment of the present invention.

FIG. 5 is a block diagram showing the structure of a first embodiment of the invention, wherein a sync signal generating circuit according to the present invention is applied to an analog-operable mirror-type DLL.

The DLL comprises an input buffer 11, an I/O replica 12, a comparator replica 13, two ramp-voltage generating circuits (RVG1, RVG2) 14 and 15, a voltage comparator 16, a DQ buffer 17 and a self-calibration feedback loop 18.

The input buffer 11 receives an external clock signal and outputs a clock signal CLK1 obtained by delaying the external clock signal. The I/O replica 12 receives the clock signal CLK1 and outputs a clock signal CLK2, which is obtained by delaying the clock signal CLK1 by a delay time substantially equal to a sum of a delay time in the input buffer 11 and a delay time in the DQ buffer 17. The comparator replica 13 receives the clock signal CLK2 and outputs a clock signal obtained by delaying the clock signal CLK2 by a delay time substantially equal to a delay time in the comparator 16. The comparator replica 13 is supplied with a control signal from the self-calibration feedback loop 18. The delay time in the comparator replica 13 is adjusted by the control signal.

The ramp-voltage generating circuit, 14, receives the clock signal from the comparator replica 13 and the clock signal CLK1 and outputs a ramp voltage (analog voltage) Vmeans. The potential level of the ramp voltage Vmeans rises at a constant gradient in synchronism with the rising of the clock signal from the comparator replica 13, and the rising of this potential level stops in synchronism with the rising of the clock signal CLK1.

The ramp-voltage generating circuit 15 receives the clock signal CLK1 and outputs a ramp voltage (analog voltage) Vdly, whose potential level rises at a constant gradient in synchronism with the rising of the clock signal CLK1.

Figure 6:
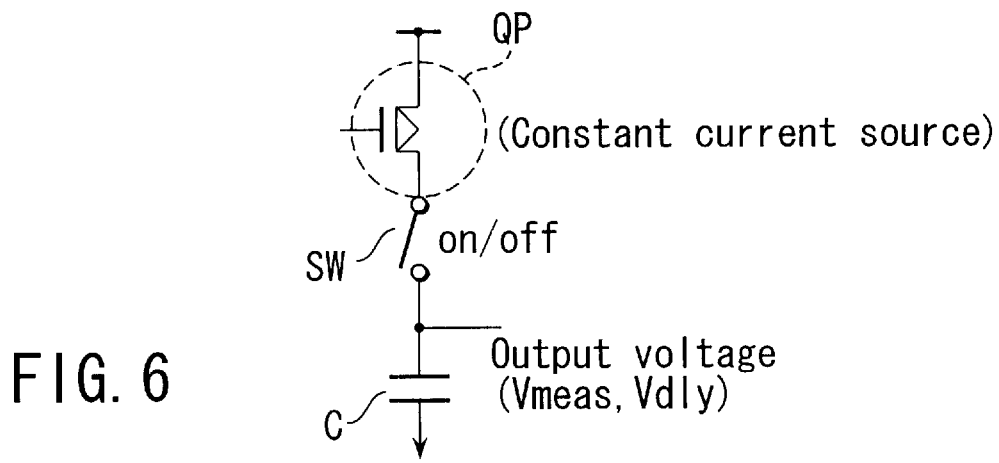
FIG. 6 is a circuit diagram for explaining a concept of a ramp-voltage generating circuit in FIG. 5.

FIG. 6 is a circuit diagram for explaining a concept of the ramp-voltage generating circuits 14, 15. A power supply node is connected to one end of a PMOSFET QP functioning as a constant current source. The other end of the PMOSFET QP is connected to a capacitor C via a switch SW.

In the ramp-voltage generating circuit 14, if the switch SW is turned on by the output clock signal from the comparator replica 13, the capacitor C is charged with a current flowing in the PMOSFET QP and the output voltage Vmeans rises at a constant potential gradient. If the switch SW is turned off by the clock signal CLK1 from the input buffer 11, the charge accumulation in the capacitor C is stopped and the rising of the output voltage Vmeans is also stopped.

After voltage comparison by the comparator 16, the output voltages Vmeans and Vdly of both ramp-voltage generating circuits 14 and 15 are reset by some means (not shown).

In both ramp-voltage generating circuits 14 and 15, currents of the same value are let to flow in the PMOSFETs functioning as constant current sources so that the output voltages Vmeans and Vdly may have the same gradient at the time of rise.

The comparator 16 receives the voltages Vmeans and Vdly, compares them and produces an internal clock signal on the basis of the comparison result.

Figure 7:
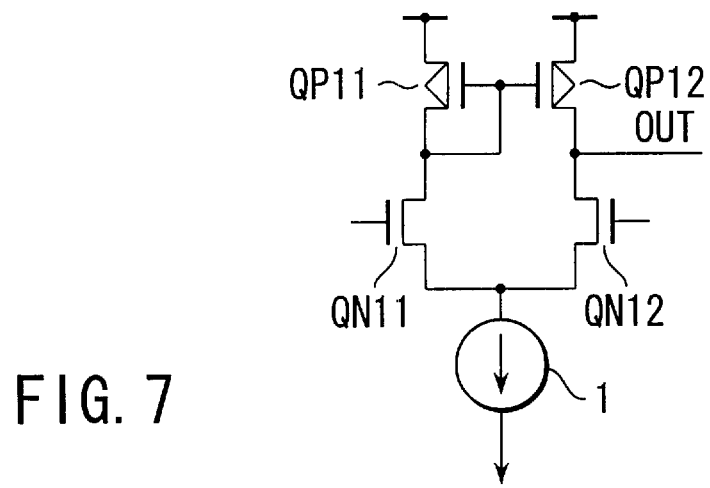
FIG. 7 is a circuit diagram showing an example of a comparator in FIG. 5.
Figure 8:
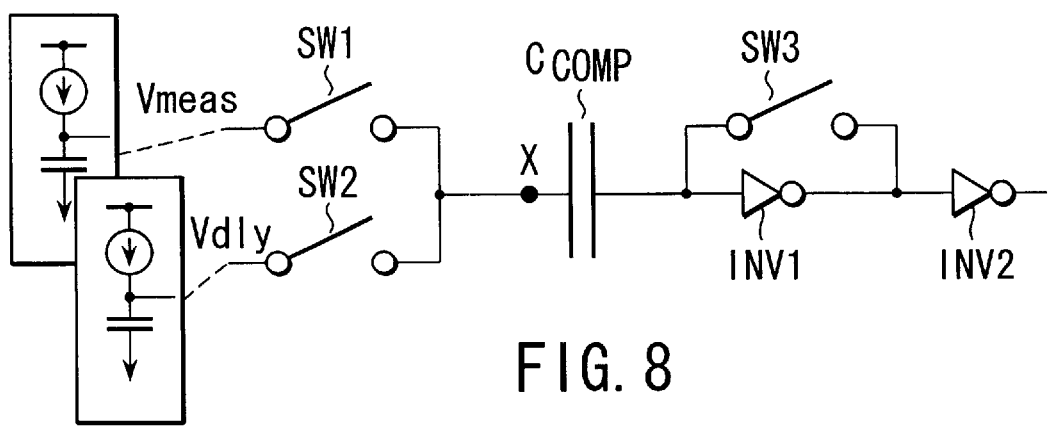
FIG. 8 is a circuit diagram showing another example of the comparator in FIG. 5.

The comparator 16 may be composed of, for example, a dynamic-type comparator as shown in FIG. 7 or FIG. 8. The dynamic-type comparator shown in FIG. 7 is a differential amplifier comprises two PMOSFETs QP11 and QP12, two NMOSFETs QN11 and QN12, and a constant current source. The dynamic-type comparator shown in FIG. 8 comprises switches SW1 to SW3, a capacitor C_COMP and inverters INV1 and INV2.

Figure 9:
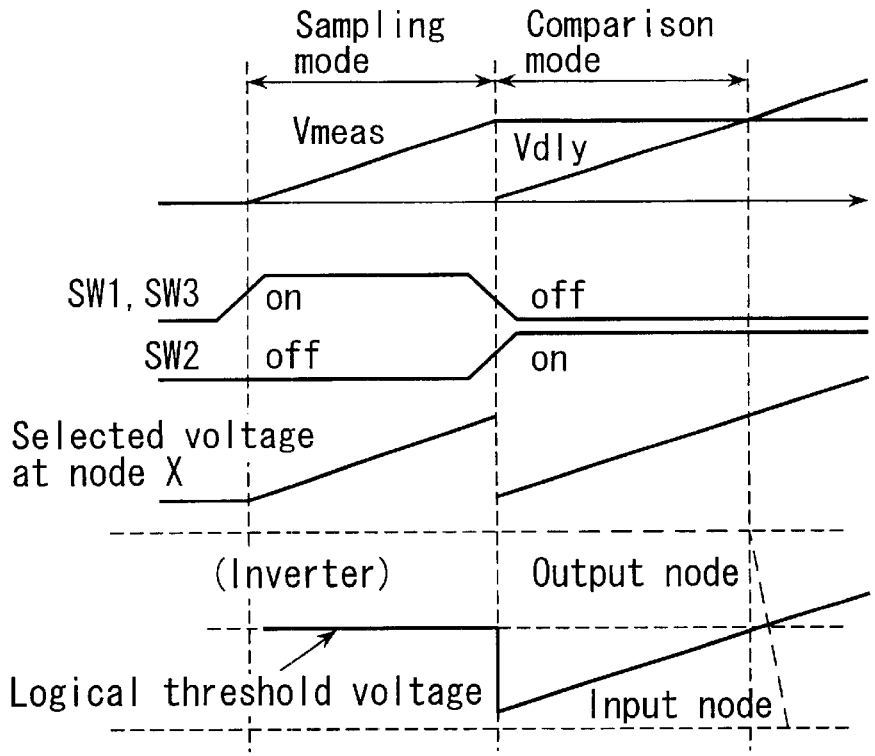
FIG. 9 is a signal waveform diagram illustrating an example of the operation of the comparator shown in FIG. 8.

FIG. 9 is a signal waveform diagram illustrating an example of the operation of the dynamic-type comparator shown in FIG. 8. The dynamic-type comparator is designed to operate in a sampling mode and a comparison mode. In the sampling mode, the switches SW1 and SW3 are turned on and the switch SW2 is turned off. In the comparison mode, the switches SW1 and SW3 are turned off and the switch SW2 is turned on.

If the switch SW1 is turned on in the sampling mode, the output voltage Vmeans of the ramp-voltage generating circuit 14 is applied to a node X at one end of the capacitor C_COMP. The potential at the node X rises as the voltage Vmeans increases.

In addition, the switch SW3 is turned on in the sampling mode and the input and output nodes of the inverter INV1 are short-circuited. Thereby, the input node-side potential of the inverter INV1 is set at a logical threshold voltage of the inverter INV1.

Subsequently, in the comparison mode, the switch SW1 is turned off and the switch SW2 is turned on. The output voltage Vdly of the other ramp-voltage generating circuit 15 is applied to the node X of the capacitor C_COMP via the switch SW2. Immediately after the states of both switches SW1 and SW2 have been changed, the potential at the node X is low since the voltage Vdly is still low, and thus the signal level at the output node of the inverter INV1 rises to an H-level. Then, the potential at the node X rises in accordance with the increase in voltage Vdly. After the voltage Vdly has become equal to the voltage Vmeans, the potential at the input node of the inverter INV1 exceeds a logical threshold voltage and the signal level at the output node of the inverter INV1 is inverted. The output from the inverter INV1 is waveform-shaped by the inverter INV2 and is output as an internal clock signal.

The DQ buffer 17 receives internal data and the internal clock signal output from the comparator 16, takes in the internal data in synchronism with the internal clock signal, and outputs the data as data DQ to the outside.

The self-calibration feedback loop 18 comprises an I/O replica 19 and a phase comparator 20. The I/O replica 19 has a delay time that is substantially equal to the delay time of the I/O replica 12. The internal clock signal produced by the comparator 16 is input to the I/O replica 19. An output clock signal from the I/O replica 19 and the clock signal CLK1 output from the input buffer 11 are delivered to the phase comparator 20. The phase comparator 20 compares the phases of both input clock signals and produces a control signal based on the comparison result. The control signal produced by the phase comparator 20 is supplied to the comparator replica 13.

In the DLL with the above-described structure, in a case where the delay time in the comparator 16 is equal to that in the comparator replica 13, the phase of the output clock signal of the I/O replica 19 in the self-calibration feedback loop 18 for delaying the internal clock signal output from the comparator 16 coincides with the phase of the output clock signal CLK1 of the input buffer 11. The reason for this will now be stated. The delay time of the output data DQ from the DQ buffer 17 relative to the internal clock signal from the comparator 16 is tOB. The delay time between the output data DQ and the output clock signal CLK1 is tIB. From the point of view of the internal clock signal produced by the comparator 16, the delay time of the output clock signal CLK1 from the input buffer 11 is (tIB+tOB). Similarly, from the point of view of the internal clock signal output from the comparator 16, the delay time of the output clock signal from the I/O replica 19 is also (tIB+tOB). This is the reason.

Assume that the delay time in the comparator 16 has become less than a design value owing to the above-described PVT variance. In this case, a phase difference between both input clock signals is detected by the phase comparator 20 in the self-calibration feedback loop 18. A control signal based on the detected phase difference is supplied to the comparator replica 13 so as to decrease the delay time in the comparator replica 13. The self-calibration feedback loop 18 performs the control operation until the delay time in the comparator replica 13 has become equal to the delay time in the comparator 16. At last, the delay time in the comparator replica 13 coincides with the delay time in the comparator 16.

In an opposite case where the delay time in the comparator 16 has become greater than the design value, a phase difference between both input clock signals is detected by the phase comparator 20 in the self-calibration feedback loop 18. A control signal based on the detected phase difference is supplied to the comparator replica 13 so as to increase the delay time in the comparator replica 13. The self-calibration feedback loop 18 performs the control operation until the delay time in the comparator replica 13 has become equal to the delay time in the comparator 16.

Even if the delay time in the comparator 16 has varied, the delay time in the comparator replica 13 is varied accordingly so that the delay time in the comparator 16 may be compensated. Thus, the comparator 16 can produce the internal clock signal whereby the data DQ output from the DQ buffer 17 can always be synchronized with the external clock signal.

Figure 10:
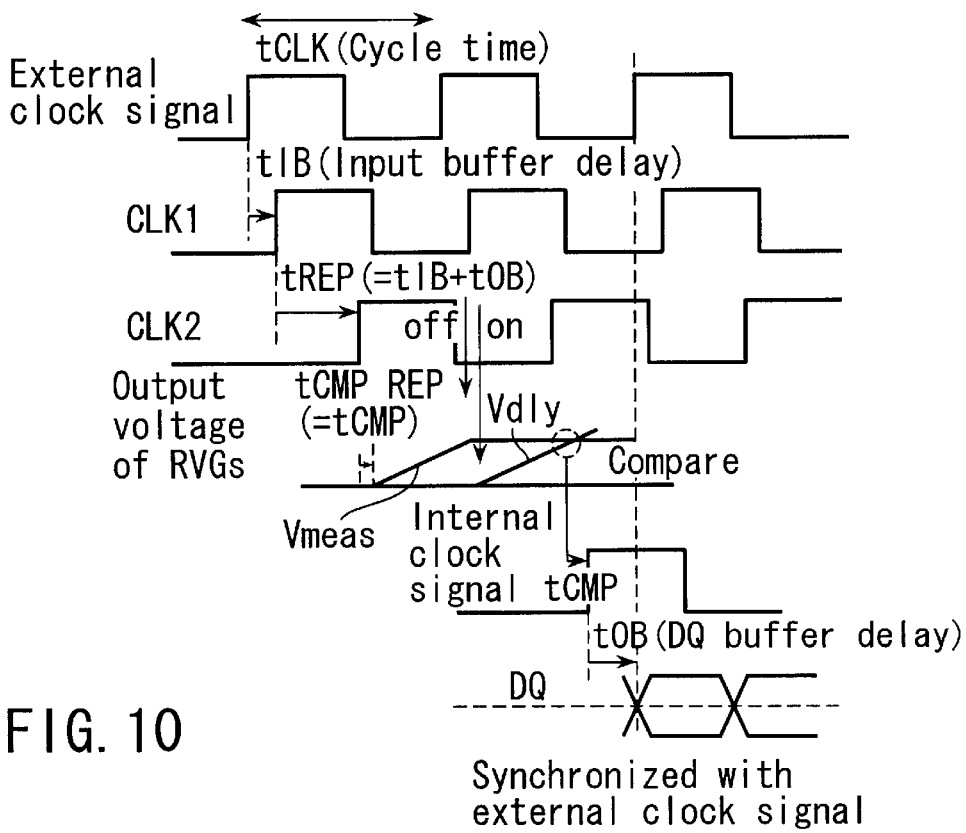
FIG. 10 is a signal waveform diagram illustrating an example of the operation of the DLL in FIG. 5.

FIG. 10 shows signal waveforms in a main part of the DLL shown in FIG. 5. In FIG. 10, symbol "tCMP_REP" denotes a delay time of the output clock signal of the comparator replica 13 relative to the clock signal CLK2. By the above-described feedback control, the delay time tCMP_REP is controlled so as to always agree with the delay time tCMP in the comparator 16.

In the DLL shown in FIG. 5, the comparator replica 13 is provided in the rear stage of the I/O replica 12. However, the same advantage can be obtained even if the positional relationship is reversed, that is, the I/O replica 12 is provided in the rear stage of the comparator replica 13.

FIG. 11 is a block diagram showing the structure of a second embodiment of the invention, wherein the sync signal generating circuit according to the present invention is applied to the mirror-type DLL. The basic structure of the DLL shown in FIG. 11 is the same as that of the DLL shown in FIG. 5. Thus, the parts common to those in FIG. 5 are denoted by like reference numerals and a description thereof is omitted. Only the points different from the DLL in FIG. 5 will be described.

The DLL shown in FIG. 11 differs from the DLL shown in FIG. 5 in that i) the comparator replica 13 with a delay time adjusting function is replaced with a comparator replica 21 without a delay time adjusting function, ii) the comparator 16 without a delay time adjusting function is replaced with a voltage comparator 22 with a delay time adjusting function, and iii) the delay time in the voltage comparator 22 is adjusted in accordance with a control signal output from the self-calibration feedback loop 18.

Specifically, in the DLL of FIG. 5, the comparator replica 13 has the delay time adjusting function and the delay time of the comparator replica 13 is adjusted in accordance with the control signal from the self-calibration feedback loop 18. By contrast, in the DLL of FIG. 11, the voltage comparator 22 for generating the internal clock signal is provided with the delay time adjusting function.

In this case, the delay time in the voltage comparator 22 is adjusted by the self-calibration feedback loop 18 so as to coincide with the delay time in the comparator replica 21.

According to this embodiment, a circuit having a proper delay time can be freely chosen and used as the comparator replica 21. For example, if a circuit with little PVT variance, such as an inverter chain of series-connected inverters, is chosen as the comparator replica 21, the operational timing of the sync circuit can be made constant irrespective of PVT variance. In addition, timing of occurrence of noise within the chip can be made constant.

Examples of the structure and operation for adjusting the delay time in the comparator replica 13 in FIG. 5 and the comparator 22 in FIG. 11 will now be described.

Such an ordinary circuit as used in a PLL or a DLL may be applied to a circuit for receiving a control signal from a phase comparator for comparing the phases of two clock signals and adjusting a delay time. For example, IEEE Journal of Solid-State Circuits, Vol. 34, No. 11, November 1999, "A 2.5-V, 333-Mb/s/pin, 1-G bit, Double-Data-Rate Synchronous DRAM" (Prior Art 1) discloses a technique which is applicable to the present invention. In this technique, a control signal output from a phase comparator is supplied to a charge pump circuit. The charge pump circuit produces a DC voltage having a value corresponding to the output signal from the phase comparator. The DC voltage is supplied to a delay line as a power supply voltage and thus the delay time in the delay line is adjusted.

FIG. 12A shows a circuit example wherein the delay time of the comparator replica 13 shown in FIG. 5 is adjusted using a charge pump circuit. A control signal output from the phase comparator 20 is supplied to a charge pump circuit 23, and the charge pump circuit 23 produces a DC voltage corresponding to the control signal. The DC voltage is supplied as a power supply voltage to a delay circuit 25 for delaying the clock signal CLK2 in the comparator replica 13. Thus, the delay time in the comparator replica 13 is adjusted.

FIG. 12B shows a circuit example wherein the delay time of the voltage comparator 22 shown in FIG. 11 is adjusted using a charge pump circuit. In this example, like FIG. 12A, the DC voltage produced by the charge pump circuit 23 is supplied as a power supply voltage to a comparator COMP. Thus, the delay time in the voltage comparator 22 is adjusted.

Figure 13:
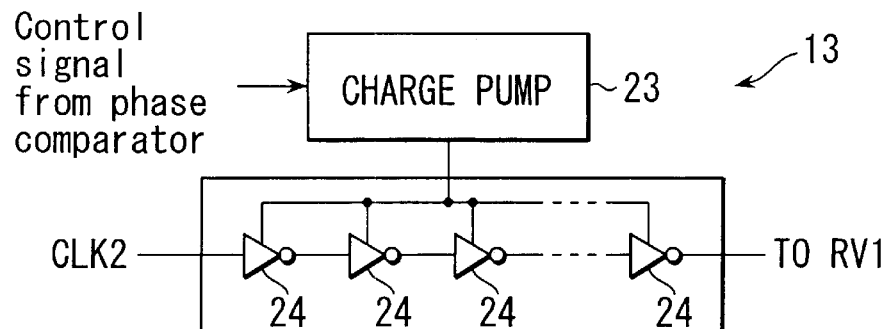
FIG. 13 shows a specific circuit example of a delay circuit in FIG. 12A.

An inverter chain comprising series-connected inverters 24, as shown in FIG. 13, is usable as the delay circuit 25 shown in FIG. 12A.

Figure 14:
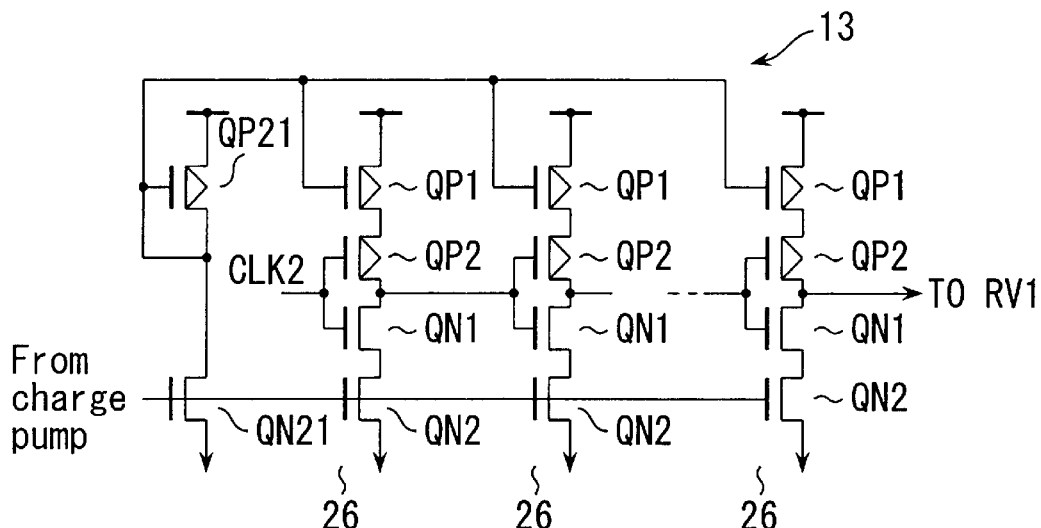
FIG. 14 shows a specific circuit example for adjusting a delay time in the DLL in FIG. 5.

FIG. 14 shows another example of the comparator replica 13 shown in FIG. 5, which is disclosed, for example, in IEEE Journal of Solid-State Circuits, Vol. 34, No. 4, April 1999, "Source-Synchronization and Timing Vernier Techniques for 1.2 GB/s SLDRAM Interfaces" (Prior Art 2). According to this technique, a delay circuit comprises a multiple stages of CMOS inverters 26. A pair of MOSFETs functioning as current-limiting elements are inserted between a pair of sources, on the one hand, and power supply nodes, on the other hand, of each inverter 26. The gates of the paired MOSFETs are supplied with a DC voltage output from the charge pump circuit and a DC voltage having a value varying in accordance with the DC voltage from the charge pump circuit. Thereby, the resistance values of the paired MOSFETs functioning as current-limiting elements are varied and the delay time of each inverter 26 is adjusted.

Specifically, in FIG. 14, two PMOSFETs QP1 and QP2 are inserted in series between a power supply node and an output node of each inverter 26, and two NMOSFETs QN1 and QN2 are inserted in series between the output node and a ground node of each inverter 26. An output voltage of the charge pump circuit 23 (shown in FIG. 12A) is applied to the gate of one of the NMOSFETs (NMOSFET QN2 in this example). One of the PMOSFETs (PMOSFET QP1 in this example) is supplied with an output voltage of a current mirror circuit which comprises a PMOSFET QP21 and an NMOSFET QN21 and receives the output voltage of the charge pump circuit 23.

With this structure, the on-resistance values of the PMOSFET QP1 and NMOSFET QN2 of each inverter 26 vary in accordance with the output voltage of the charge pump circuit 23, whereby the delay time of each inverter 26 is controlled.

In the above description, the MOSFET (PMOSFET QP1, NMOSFET QN2) functioning as the current-limiting element is provided on each of the P-channel side and N-channel side. However, this MOSFET may be provided on only one of the P-channel side and N-channel side.

Figure 15:
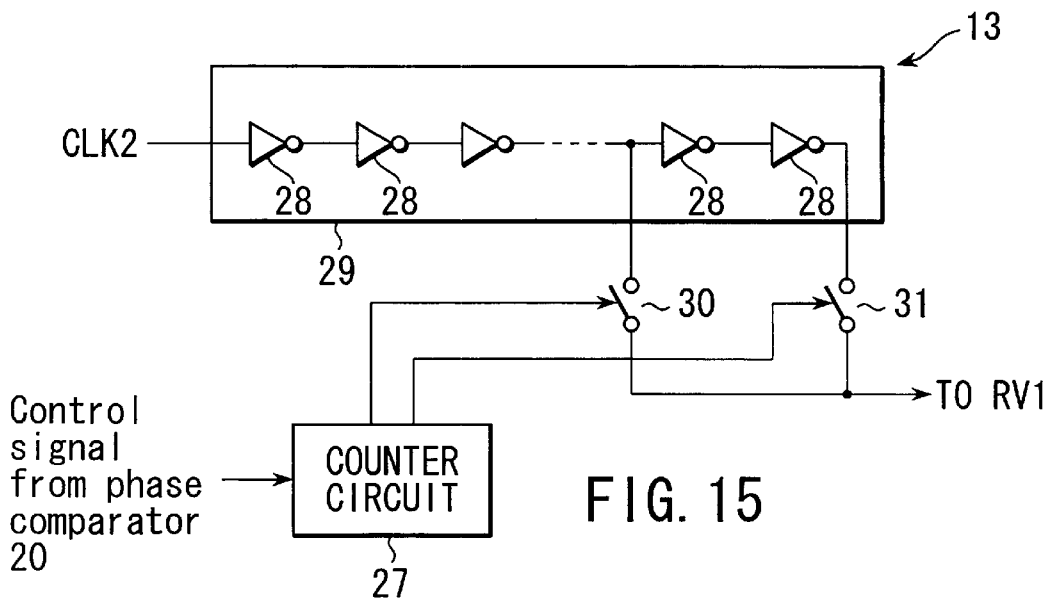
FIG. 15 shows another specific circuit example for adjusting a delay time in the DLL in FIG. 5.

FIG. 15 shows still another example of the comparator replica 13 shown in FIG. 5. This comparator replica 13 is described in the above-mentioned Prior Art 1. The comparator replica 13 has a counter circuit 27 for counting a control signal output from the phase comparator 20. On the basis of the count state of the counter circuit 27, the number of delay elements for delaying the signal is adjusted and thus the delay time is adjusted.

Specifically, the control signal from the phase comparator 20 (shown in FIG. 5) is counted by the counter circuit 27. On the other hand, a plurality of inverters 28 functioning as delay elements are connected in multiple stages to constitute an inverter chain 29. Output nodes of two different inverters (the ultimate and antepenultimate inverters in this example) of the inverter chain 29 are connected to first ends of two switches 30 and 31. Second ends of the two switches 30 and 31 are commonly connected. The two switches 30 and 31 are turned on/off by control signals delivered from two different count output nodes of the counter circuit 27.

In the comparator replica 13 with this structure, a control signal output from one of the two different count output nodes of the counter circuit 27 is activated by the control signal from the phase comparator 20. One of the two switches 30 and 31, which receives the activated control signal, is turned on and the output from the associated inverter 28 is supplied to the subsequent-stage circuit.

The signal output from the turned-on switch 30 and the signal output from the turned-on switch 31 have different delay times relative to the input signal, or the clock signal CLK2, since the number of inverters in the current path leading to the switch 30 is different from that of inverters in the current path leading to the switch 31. The delay time can thus be adjusted.

In the second embodiment, where the voltage comparator 22 capable of adjusting the delay time is to be composed of a voltage comparing circuit for comparing voltages and a delay circuit provided in a rear-stage of the voltage comparing circuit, the circuit having the structure as shown in any one of FIGS. 13 to 15 may be used for the delay circuit.

Figure 1:
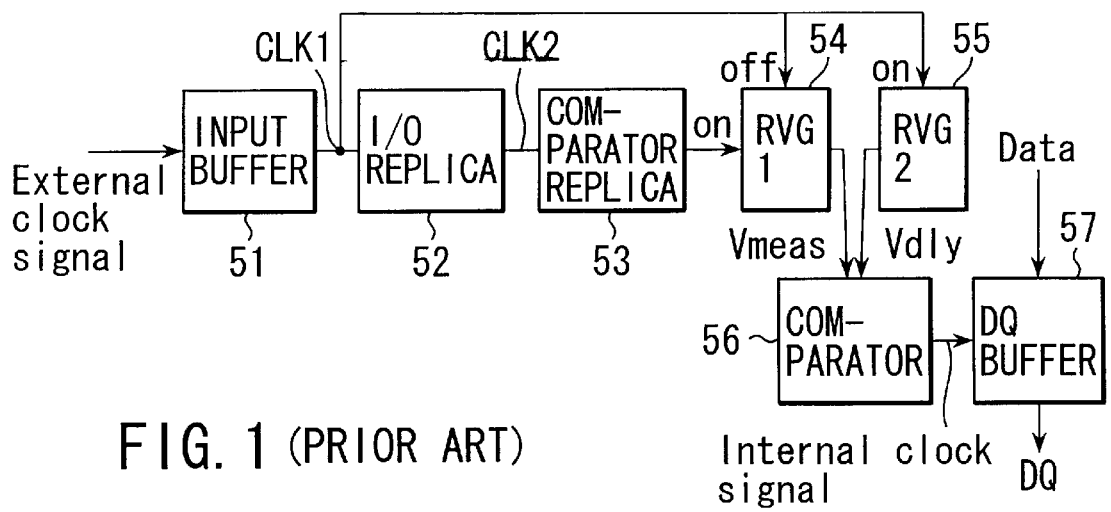
FIG. 1 is a block diagram showing an example of a conventional analog-operable mirror-type DLL.
Figure 2:
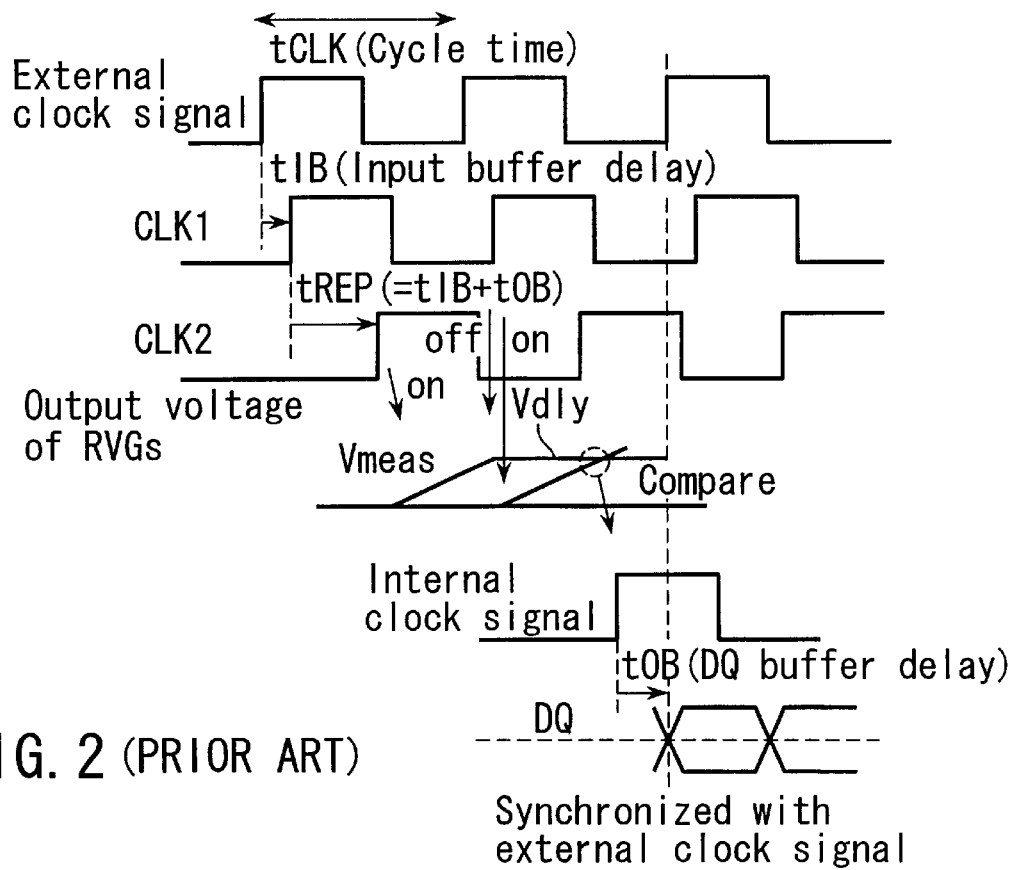
FIG. 2 is a signal waveform diagram illustrating an example of the operation of the DLL shown in FIG. 1.
Figure 3:
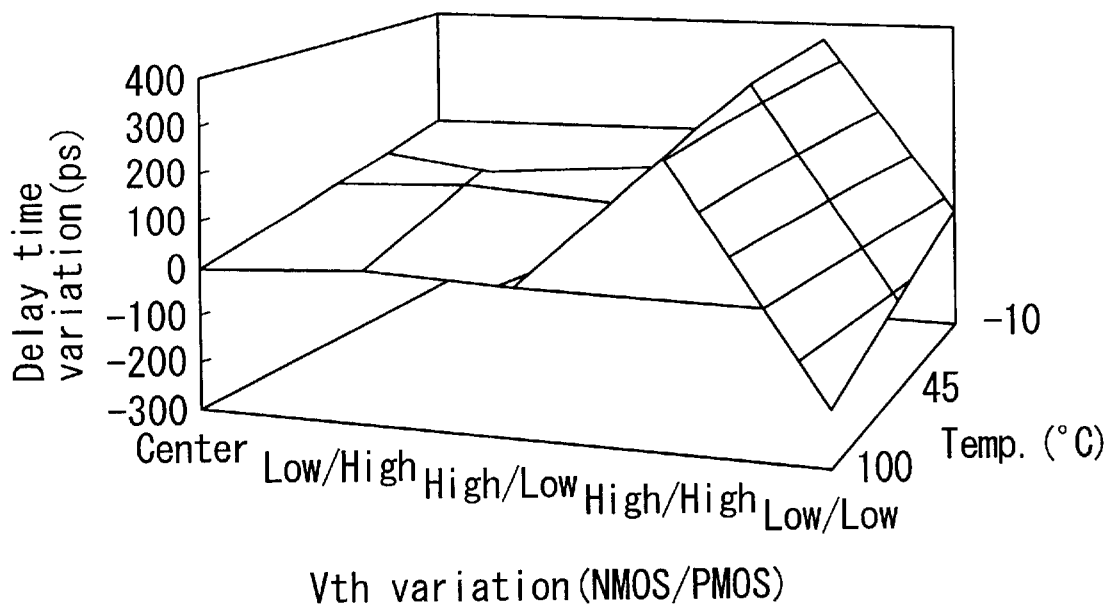
FIG. 3 shows delay time variation characteristics of a dynamic-type comparator used in the DLL shown in FIG. 1.
Figure 4:
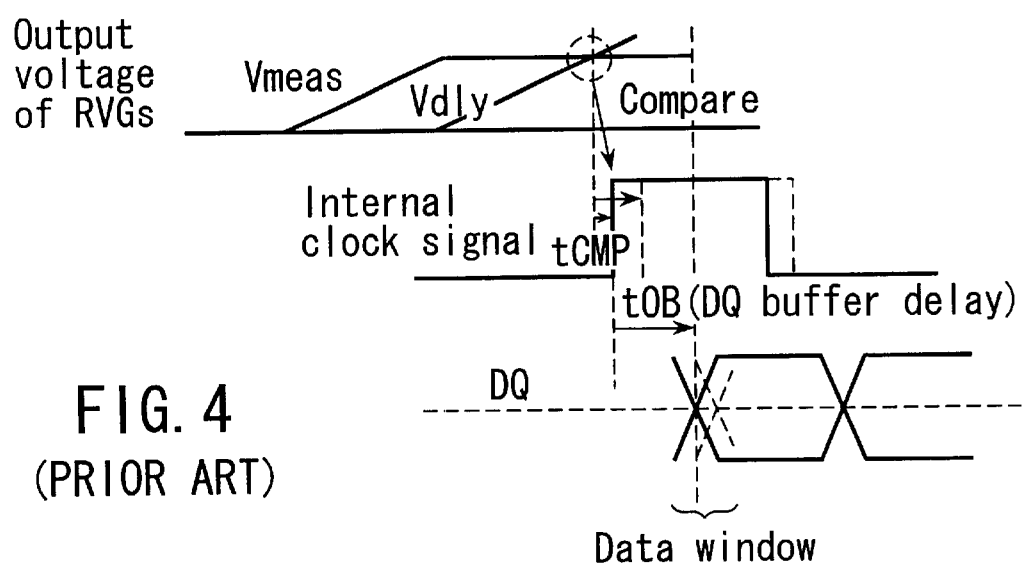
FIG. 4 is a signal waveform diagram for explaining a sync error in the DLL shown in FIG. 1.

As has been described above, the delay time of the comparator comprising an analog circuit varies due to the PVT variance. As is understandable from FIG. 3, in particular, the influence of variance in the process is serious. However, the variance in the process is basically not a variance occurring in the operating state. Once this variance is compensated, there is no need to adjust it in the operating state. Accordingly, if the variance in the process is once adjusted at the time of power-on, only variances due to temperature and voltage need to be adjusted.

In modern LSIs, an internal power supply voltage, which is reduced compared to an external power supply voltage, is used and no high-speed variation will occur in the power supply voltage. Besides, the rate of variation due to temperatures is very low, compared to the operation speed of the sync circuit. Accordingly, there is no need to always adjust the variation due to temperature or voltage. It is sufficient to intermittently perform adjustment at regular intervals so as to prevent the occurrence of a serious sync error from a design value.

A description will now be given of an embodiment of the invention wherein the delay time is intermittently adjusted.

Figure 16:
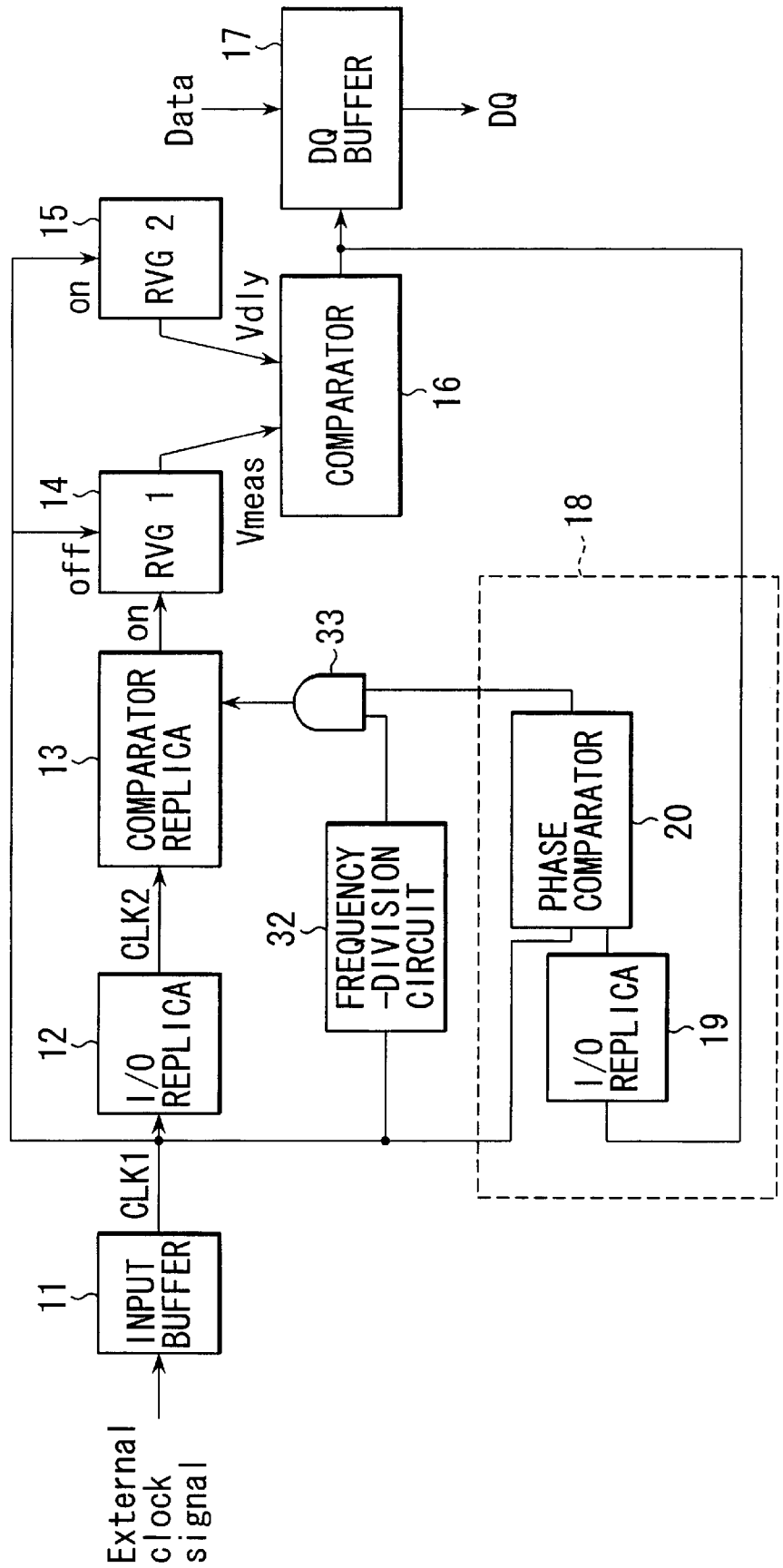
FIG. 16 is a block diagram showing the structure of a mirror-type DLL according to a third embodiment of the present invention.

FIG. 16 is a block diagram showing the structure of a mirror-type DLL according to a third embodiment of the present invention. The basic structure of the DLL shown in FIG. 16 is the same as that of the DLL shown in FIG. 5. Thus, the parts common to those in FIG. 5 are denoted by like reference numerals and a description thereof is omitted. Only the point different from the DLL in FIG. 5 will be described.

The difference between the DLL of FIG. 16 and that of FIG. 5 is that a frequency-division circuit 32 and an AND gate 33 are newly added.

The frequency-division circuit 32 receives the clock signal CLK1 from the input buffer 11. The frequency-division circuit 32 frequency-divides the clock signal CLK1 at a predetermined frequency-division ratio and outputs the resultant signal to the AND gate 33. The output signal of the AND gate 33 is supplied to the comparator replica 13.

In the DLL of this embodiment, the control signal from the phase comparator 20 is supplied to the comparator replica 13 after the AND gate 33 obtains an AND logic value between the frequency-division output from the frequency-division circuit 32 and the control signal from the phase comparator 20.

According to this structure, the control signal from the phase comparator 20 is input to the comparator replica 13 only during a time period in which the frequency-division output from the frequency-division circuit 32 is being activated. Thus, the delay time in the comparator replica 13 is intermittently adjusted in accordance with the frequency-division output of the frequency-division circuit 32.

Figure 17:
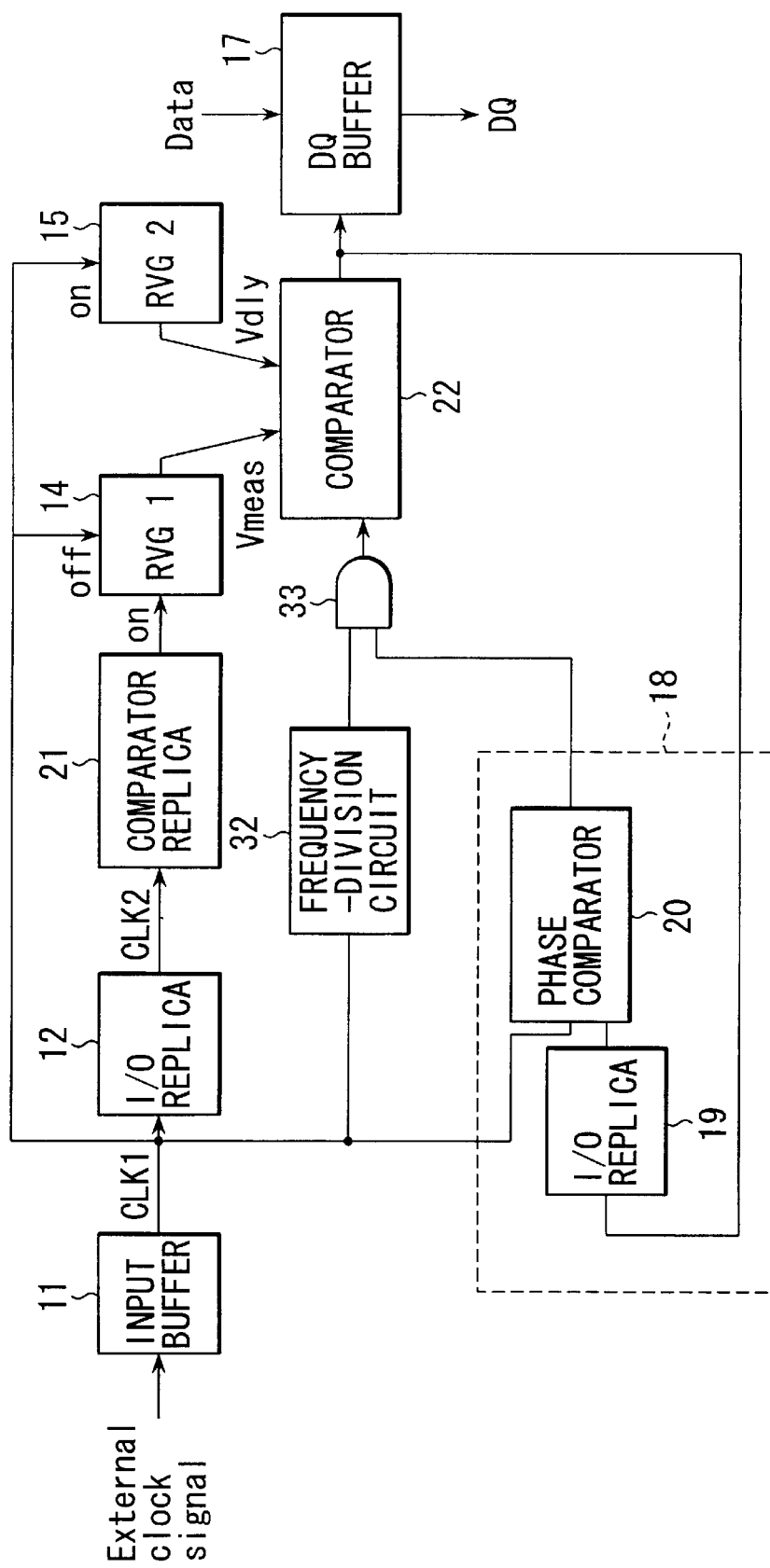
FIG. 17 is a block diagram showing the structure of a mirror-type DLL according to a fourth embodiment of the present invention.

FIG. 17 is a block diagram showing the structure of a mirror-type DLL according to a fourth embodiment of the present invention. The basic structure of the DLL shown in FIG. 17 is the same as that of the DLL shown in FIG. 11. Thus, the parts common to those in FIG. 11 are denoted by like reference numerals and a description thereof is omitted. Only the point different from the DLL in FIG. 11 will be described.

The difference between the DLL of FIG. 17 and that of FIG. 11 is that a frequency-division circuit 32 and an AND gate 33 are newly added, like the third embodiment shown in FIG. 16. Since the frequency-division circuit 32 and AND gate 33 have been described in detail in connection with the third embodiment shown in FIG. 16, a description thereof is omitted here.

According to this fourth embodiment, the control signal from the phase comparator 20 is input to the voltage comparator 22 only during a time period in which the frequency-division output from the frequency-division circuit 32 is being activated. Thus, the delay time in the voltage comparator 22 is intermittently adjusted in accordance with the frequency-division output of the frequency-division circuit 32.

In the third and fourth embodiments, the output clock signal CLK1 from the input buffer 11 is frequency-divided by the frequency-division circuit 32 and the resultant signal is supplied to the AND gate 33. However, the same advantage can be obtained even if the external clock signal or the internal clock signal from the comparator 16 or 22 is frequency-divided and the resultant signal is supplied to the AND gate 33.

Figure 18:
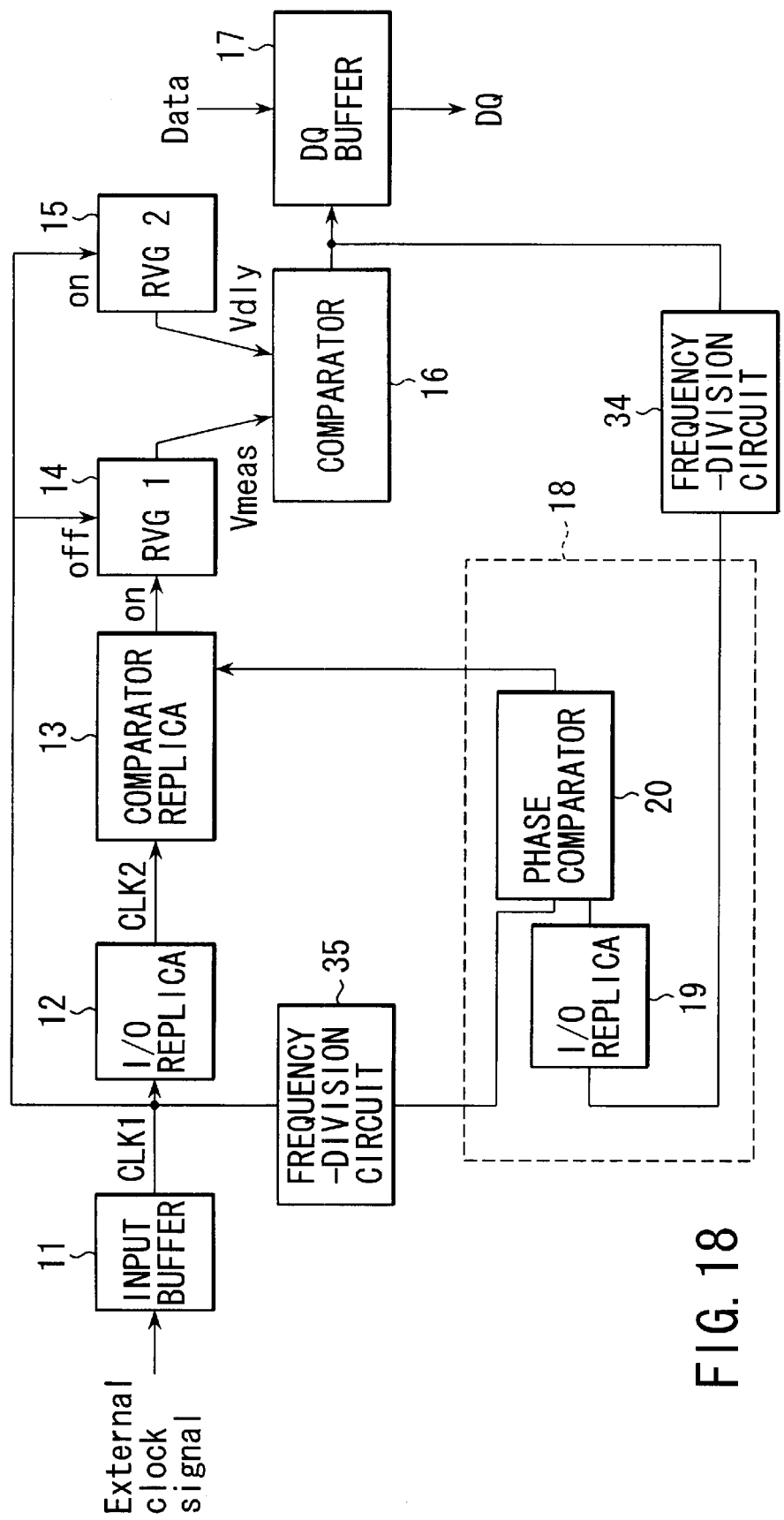
FIG. 18 is a block diagram showing the structure of a mirror-type DLL according to a fifth embodiment of the present invention.

FIG. 18 is a block diagram showing the structure of a mirror-type DLL according to a fifth embodiment of the present invention. The basic structure of the DLL shown in FIG. 18 is the same as that of the DLL shown in FIG. 5. Thus, the parts common to those in FIG. 5 are denoted by like reference numerals and a description thereof is omitted. Only the point different from the DLL in FIG. 5 will be described.

The difference between the DLL of FIG. 18 and that of FIG. 5 is that two frequency-division circuits 34 and 35 are newly added.

The frequency-division circuit 34 is inserted in the transmission path between the comparator 16 and the I/O replica 19 of the self-calibration feedback loop 18. The other frequency-division circuit 35 is inserted in the transmission path of the clock signal CLK1 between the input buffer 11 and the phase comparator 20 of the self-calibration feedback loop 18.

According to this structure, the cycle of the two clock signals input to the phase comparator 20 is made longer than that in the embodiment shown in FIG. 5. Thus, the delay time in the comparator replica 13 is intermittently controlled.

Figure 19:
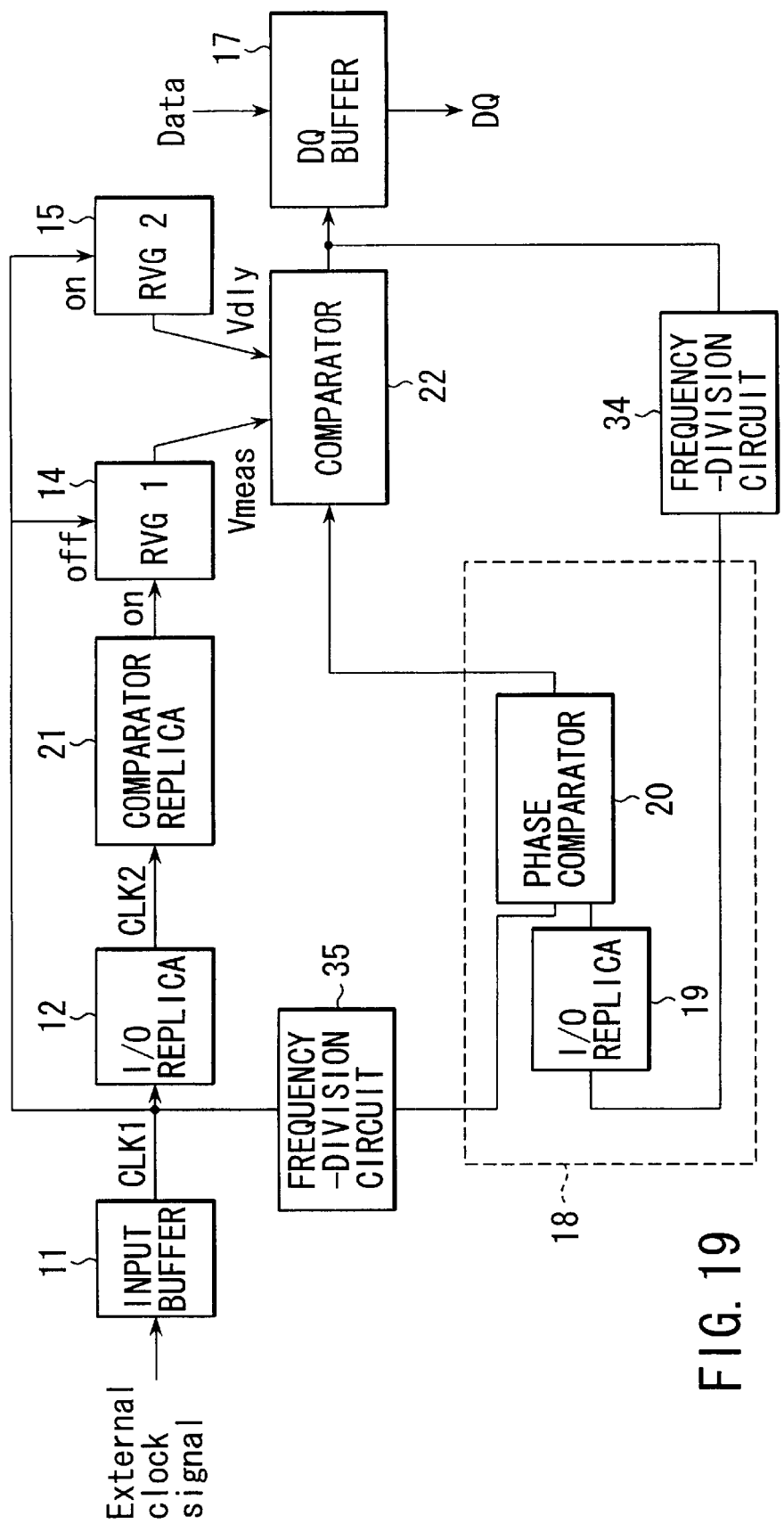
FIG. 19 is a block diagram showing the structure of a mirror-type DLL according to a sixth embodiment of the present invention.

FIG. 19 is a block diagram showing the structure of a mirror-type DLL according to a sixth embodiment of the present invention. The basic structure of the DLL shown in FIG. 19 is the same as that of the DLL shown in FIG. 11. Thus, the parts common to those in FIG. 11 are denoted by like reference numerals and a description thereof is omitted. Only the point different from the DLL in FIG. 11 will be described.

The difference between the DLL of FIG. 19 and that of FIG. 11 is that two frequency-division circuits 34 and 35 are newly added, like the embodiment of FIG. 18. Since the two frequency-division circuits 34 and 35 have been described in detail in connection with the embodiment shown in FIG. 18, a description thereof is omitted.

In this sixth embodiment, the cycle of the two clock signals input to the phase comparator 20 is made longer than that in the embodiment shown in FIG. 11. Thus, the delay time in the comparator 22 is intermittently controlled.

In a DRAM (Dynamic Random Access Memory), a self-refresh operation is performed. In the self-refresh operation, data stored in a dynamic memory cell is read out by a sense amplifier and then re-stored in this memory cell. The operation of the DLL is stopped in the self-refresh operation in order to reduce the consumed current. However, even when the self-refresh operation is not performed, the operation of the DLL can be stopped if data transmission/reception is not effected at the I/O section. The reason is that even if the operation of the DLL is started after the chip has received a read command, the operation of the DLL has been locked (i.e. in a state in which an internal clock signal synchronized with an external clock signal can be obtained) by the time data is actually output from the chip.

Assume that the DLL shown in FIGS. 16 and 17 is built in the DRAM. In this case, in order to eliminate the effect due to temperature variations, the feedback circuit portion alone is intermittently operated at a longer cycle than a normal cycle even when data transmission/reception is not performed. Thereby, in the case of the embodiment in FIG. 16, the delay time in the comparator replica 13 can be made substantially equal to the delay time in the comparator 16. In the case of the embodiment in FIG. 17, the delay time in the comparator 22 can be made substantially equal to the delay time in the comparator replica 21. Moreover, the power consumption can be reduced.

Figure 20:
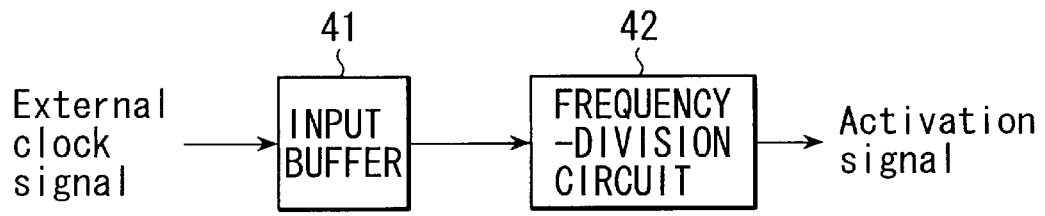
FIG. 20 is a block diagram showing an example of the structure of an activation circuit substituted for a frequency-division circuit in each of the embodiments shown in FIGS. 16 and 17.

The same can be said of the self-refresh operation. It is preferable to continue to compensate the delay time due to the temperature variation in the chip even during the self-refresh operation, in order that the DLL operation may be locked immediately after the DRAM has exited from the self-refresh operation. In this case, it is necessary that the external clock signal be intermittently taken in during the self-refresh operation and a feedback operation be performed by the DLL. In order to perform such an intermittent operation, an activation circuit is provided as shown in FIG. 20. The activation circuit comprises an input buffer 41 for receiving the external clock signal and a frequency-division circuit 42 for frequency-dividing an output from the input buffer 41. Instead of the output from the frequency-division circuit 32 shown in FIG. 16 (17), the clock signal output from the frequency-division circuit 42 is input to the AND gate 33. If the DRAM has exited from the self-refresh operation, an H-level signal, instead of the output from the frequency-division circuit 42, is input to the AND gate 33 by some means (not shown). Thereby, the output from the phase comparator 20 is supplied to the comparator replica 13 or voltage comparator 22. Thus, the delay time is adjusted at a shorter cycle than in the self-refresh operation.

Figure 21:
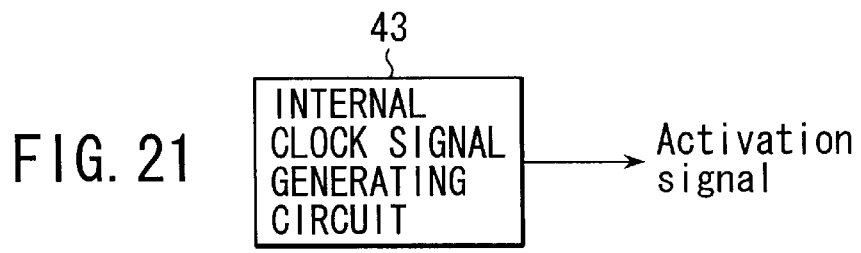
FIG. 21 is a block diagram showing another example of the structure of the activation circuit substituted for the frequency-division circuit in each of the embodiments shown in FIGS. 16 and 17.

FIG. 21 is a block diagram showing another example of the structure of the activation circuit, which may be substituted for the activation circuit shown in FIG. 20. This activation circuit comprises an internal clock signal generating circuit 43 that is exclusively used for activation. Instead of the output from the frequency-division circuit 32 shown in FIG. 16 (17), the clock signal output from the internal clock signal generating circuit 43 is input to the AND gate 33. In this case, too, if the DRAM has exited from the self-refresh operation, an H-level signal, instead of the output from the internal clock signal generating circuit 43, is input to the AND gate 33. Thereby, the output from the phase comparator 20 is supplied to the comparator replica 13 or voltage comparator 22. Thus, the delay time is adjusted at a shorter cycle than in the self-refresh operation.

Figure 22:
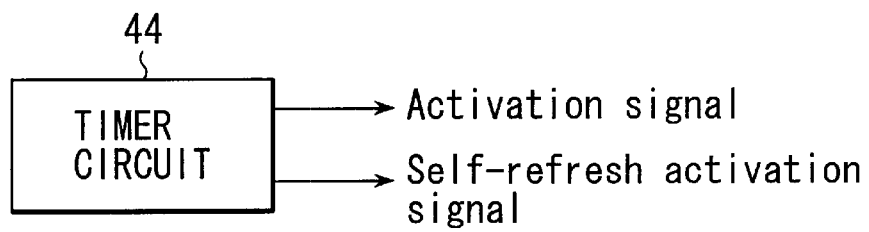
FIG. 22 is a block diagram showing still another example of the structure of the activation circuit substituted for the frequency-division circuit in each of the embodiments shown in FIGS. 16 and 17.

FIG. 22 is a block diagram showing still another example of the structure of the activation circuit, which may be substituted for the activation circuit shown in FIG. 20. In order to control the self-refresh operation, the DRAM incorporates within the chip a timer-equipped clock signal generating circuit or a temperature-monitor-equipped clock signal generating circuit as a timer for determining a self-refresh cycle. In the activation circuit shown in FIG. 22, a timer circuit 44 for determining the self-refresh cycle is made usable also as an activation circuit. One of two signals output from the timer circuit 44, instead of the output from the frequency-division circuit 32 shown in FIG. 16 (17), is input as an activation signal to the AND gate 33. The other signal from the timer circuit 44 is input as a self-refresh activation signal to a circuit for controlling the self-refresh operation. In this case, too, if the DRAM has exited from the self-refresh operation, an H-level signal, instead of the output from the timer circuit 44, is input to the AND gate 33. Thereby, the output from the phase comparator 20 is supplied to the comparator replica 13 or voltage comparator 22. Thus, the delay time is adjusted at a shorter cycle than in the self-refresh operation.

In each of the above-described embodiments, this invention is applied to the analog-operable mirror-type DLL. Needless to say, however, this invention is applicable to digital-operable mirror-type DLLs. A PVT variance may occur even in the digital mirror-type DLL. If the present invention is applied to the digital mirror-type DLL, a sync error of the internal clock signal due to the PVT variance can be prevented, and high-precision sync characteristics can be obtained.

Figure 23:
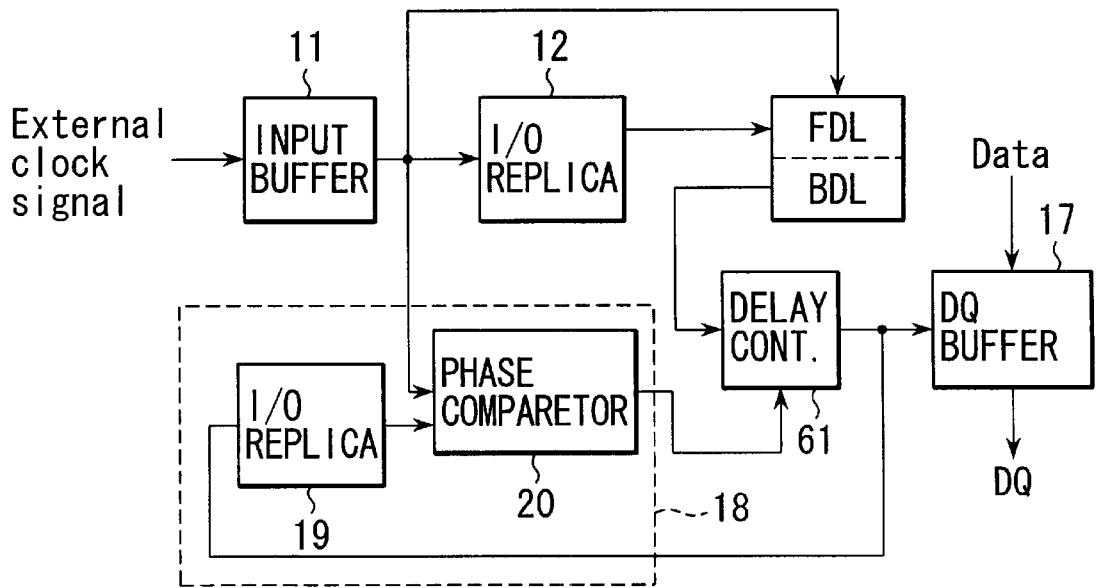
FIG. 23 is a block diagram showing the structure of a mirror-type DLL according to a seventh embodiment of the present invention.

FIG. 23 is a block diagram showing the structure of a seventh embodiment of the present invention, wherein this invention is applied to a digital mirror-type DLL. A basic structure of the digital mirror-type DLL is disclosed, for example, in Jpn. Pat. Appln. KOKAI Publication No. 10-69326 which relates to a STBD (Synchronous Traced Backwards Delay). The entire contents of this document are incorporated by reference herein.

The STBD includes an input buffer 11, an I/O replica 12 functioning as a delay monitor, a forward delay line FDL having a plurality of tandem-connected elemental delay units, and a backward delay line BDL having the same number of tandem-connected elemental delay units as the number of the elemental delay units of the forward delay line FDL. In addition, the digital mirror-type DLL shown in FIG. 23 includes a delay control circuit (delay cont.) 61 that receives an output from the backward delay line BDL and has a variable delay time. An output of the delay control circuit 61 is supplied as an internal clock signal to the DQ buffer 17. In FIG. 23, the parts common to those in FIGS. 5 and 11 are denoted by like reference numerals, and a description thereof is omitted.

The forward delay line FDL receives the outputs from the I/O replica 12 and the input buffer 11. When the level of the output from the I/O replica 12 transits, the output of the I/O replica 12 is successively delayed by the tandem-connected elemental delay units of the forward delay line FDL. The delay operation is stopped when the output level of the input buffer 11 transits subsequently. The backward delay line BDL receives the output from the input buffer 11. After the delay operation in the forward delay line FDL is stopped, the output from the input buffer 11 is successively delayed by the same number of elemental delay units of the backward delay line BDL as the elemental delay units of the forward delay line FDL through which the output from the I/O replica 12 has propagated. Accordingly, the signal delay in the backward delay line BDL is the same as that in the forward delay line FDL.

The signal delay time in the delay control circuit 61 is controlled in accordance with a comparison result obtained by the phase comparator 20. Thereby, a sync error due to a PVT variance occurring, for example, between the forward delay line FDL and backward delay line BDL can be suppressed.

As has been described above, the sync signal generating circuit of the present invention has such excellent characteristics of an analog-operable mirror-type DLL that it is free of a quantization error and has high-precision operational characteristics. Furthermore, a variation in the delay time due to a fabrication process, voltage used and temperature in operation can be compensated, and high-precision sync characteristics can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sync signal generating circuit comprising:

an input buffer circuit to which an external clock signal is input;

a first delay circuit, connected to the input buffer circuit, for delaying an output of the input buffer circuit by a first time period and delivering a delayed output;

a variable delay circuit, connected to the first delay circuit, for delaying the output of the first delay circuit and delivering a delayed output;

a first voltage generating circuit, connected to the variable delay circuit and the input buffer circuit, for outputting a first analog voltage whose potential level begins to rise at a predetermined gradient at a time of transition of a level of the output of the variable delay circuit, and stops rising at a time of transition of a level of the output of the input buffer circuit;

a second voltage generating circuit, connected to the input buffer circuit, for outputting a second analog voltage whose potential level begins to rise at a predetermined gradient at a time of transition of a level of the output of the input buffer circuit;

a voltage comparing circuit, connected to the first and second voltage generating circuits, for comparing the first and second analog voltages and outputting an internal clock signal;

an internal circuit connected to the voltage comparing circuit, an operation of the internal circuit being controlled in synchronism with the internal clock signal;

a second delay circuit, connected to the voltage comparing circuit, for delaying the internal clock signal by a second time period that is substantially equal to said first time period, and delivering a delayed output; and a phase comparator, connected to the second delay circuit and the input buffer circuit, for comparing phases of outputs of the second delay circuit and the input buffer circuit, and outputting a control signal corresponding to a phase difference obtained by the comparison of the outputs, wherein a delay time in said variable delay circuit is adjusted on the basis of the control signal output from the phase comparator.

2. The sync signal generating circuit according to claim 1, wherein said first time period in the first delay circuit is substantially equal to a sum of a signal delay time of the input buffer circuit relative to the external clock signal and a signal delay time of the internal circuit relative to the internal clock signal.

3. The sync signal generating circuit according to claim 1, wherein said variable delay circuit comprises:

a charge pump circuit for receiving the control signal and outputting a DC voltage corresponding to the control signal; and a third delay circuit having a power supply node and supplied with the DC voltage output from the charge pump circuit.

4. The sync signal generating circuit according to claim 3, wherein said third delay circuit has tandem-connected inverters.

5. The sync signal generating circuit according to claim 2, wherein said variable delay circuit comprises:

a charge pump circuit for receiving the control signal and outputting a DC voltage corresponding to the control signal;

a multiple stages of tandem-connected delay circuits; and a current-limiting element inserted between each of the delay circuits and a power supply node and controlled to have a turn-on resistance varying on the basis of the DC voltage output from the charge pump circuit.

6. The sync signal generating circuit according to claim 5, wherein each of said delay circuits is a CMOS inverter circuit.

7. The sync signal generating circuit according to claim 2, wherein said variable delay circuit comprises:

a third delay circuit connected to the first delay circuit;

a counter circuit, connected to the phase comparator, for counting the control signal; and a delay control circuit, connected to the counter circuit and the third delay circuit, for controlling the third delay circuit in accordance with the output of the counter circuit.

8. The sync signal generating circuit according to claim 7, wherein said third delay circuit comprises tandem-connected inverters, and said delay control circuit comprises a selector circuit for selecting different outputs of the inverters of the third delay circuit and delivering the selected outputs.

9. The sync signal generating circuit according to claim 1, further comprising a control signal output controller circuit, connected to the phase comparator and the variable delay circuit, for supplying the control signal from the phase comparator to the variable delay circuit at a predetermined timing.

10. The sync signal generating circuit according to claim 9, wherein said control signal output controller circuit comprises:

a frequency-division circuit, connected to the first delay circuit, for frequency-dividing the external clock signal; and a logic circuit, connected to the frequency-division circuit, the phase comparator and the variable delay circuit, for obtaining a logic signal based on an output of the frequency-division circuit and the control signal, and supplying the logic signal to the variable delay circuit.

11. The sync signal generating circuit according to claim 9, wherein said control signal output controller circuit comprises:
an internal clock signal generating circuit for outputting an internal clock signal; and
a logic circuit, connected to the internal clock signal generating circuit, the phase comparator and the variable delay circuit, for obtaining a logic signal based on the internal clock signal and the control signal, and supplying the logic signal to the variable delay circuit.

12. The sync signal generating circuit according to claim 9, wherein said internal circuit is a DQ buffer circuit, built in a DRAM, for outputting internal data in synchronism with the internal clock signal, and
said control signal output controller circuit comprises:
a self-refresh clock signal generating circuit for outputting a refresh clock signal to be used for controlling a self-refresh operation of the DRAM; and
a logic circuit, connected to the self-refresh clock signal generating circuit, the phase comparator and the variable delay circuit, for obtaining a logic signal based on the refresh clock signal and the control signal, and supplying the logic signal to the variable delay circuit.

13. A sync signal generating circuit comprising:
an input buffer circuit to which an external clock signal is input;
a first delay circuit, connected to the input buffer circuit, for delaying an output of the input buffer circuit by a first time period and delivering a delayed output;
a variable delay circuit, connected to the first delay circuit, for delaying the output of the first delay circuit and delivering a delayed output;
a first voltage generating circuit, connected to the variable delay circuit and the input buffer circuit, for outputting a first analog voltage whose potential level begins to rise at a predetermined gradient at a time of transition of a level of the output of the variable delay circuit, and stops rising at a time of transition of a level of the output of the input buffer circuit;
a second voltage generating circuit, connected to the input buffer circuit, for outputting a second analog voltage whose potential level begins to rise at a predetermined gradient at a time of transition of a level of the output of the input buffer circuit;
a voltage comparing circuit, connected to the first and second voltage generating circuits, for comparing the first and second analog voltages and outputting an internal clock signal;
an internal circuit connected to the voltage comparing circuit, an operation of the internal circuit being controlled in synchronism with the internal clock signal;
a first frequency-division circuit, connected to the voltage comparing circuit, for frequency-dividing the internal clock signal and delivering a frequency-division output;
a second delay circuit, connected to the first frequency-division circuit, for delaying the output of the first frequency-division circuit by a second time period that is substantially equal to said first time period, and delivering a delayed output;
a second frequency-division circuit, connected to the input buffer circuit, for frequency-dividing the output of the input buffer circuit and delivering a frequency-division output; and
a phase comparator, connected to the second delay circuit, the second frequency-division circuit and the variable delay circuit, for comparing phases of outputs of the second delay circuit and the second frequency-division circuit, and outputting a control signal corresponding to a phase difference obtained by the comparison of the outputs to the variable delay circuit,
wherein a delay time in said variable delay circuit is adjusted on the basis of the control signal output from the phase comparator.

14. The sync signal generating circuit according to claim 13, wherein said first time period in the first delay circuit is substantially equal to a sum of a signal delay time of the input buffer circuit relative to the external clock signal and a signal delay time of the internal circuit relative to the internal clock signal.

15. The sync signal generating circuit according to claim 13, wherein said variable delay circuit comprises:
a charge pump circuit for receiving the control signal and outputting a DC voltage corresponding to the control signal; and
a third delay circuit having a power supply node and supplied with the DC voltage output from the charge pump circuit.

16. The sync signal generating circuit according to claim 15, wherein said third delay circuit has tandem-connected inverters.

17. The sync signal generating circuit according to claim 13, wherein said variable delay circuit comprises:
a charge pump circuit for receiving the control signal and outputting a DC voltage corresponding to the control signal;
tandem-connected delay circuits; and
a current-limiting element inserted between each of the delay circuits and a power supply node and controlled to have a turn-on resistance varying on the basis of the DC voltage output from the charge pump circuit.

18. The sync signal generating circuit according to claim 17, wherein each of said delay circuits is a CMOS inverter circuit.

19. The sync signal generating circuit according to claim 13, wherein said variable delay circuit comprises:
a third delay circuit connected to the first delay circuit;
a counter circuit, connected to the phase comparator, for counting the control signal; and
a delay control circuit, connected to the counter circuit and the third delay circuit, for controlling the third delay circuit in accordance with the output of the counter circuit.

20. The sync signal generating circuit according to claim 19, wherein said third delay circuit comprises tandem-connected inverters, and
said delay control circuit comprises a selector circuit for selecting different outputs of the inverters of the third delay circuit and delivering the selected outputs.

21. A sync signal generating circuit comprising:
an input buffer circuit to which an external clock signal is input;
a first delay circuit, connected to the input buffer circuit, for delaying an output of the input buffer circuit by a first time period and delivering a delayed output;

a second delay circuit, connected to the first delay circuit, for delaying the output of the first delay circuit by a second time period and delivering a delayed output;

a first voltage generating circuit, connected to the second delay circuit and the input buffer circuit, for outputting a first analog voltage whose potential level begins to rise at a predetermined gradient at a time of transition of a level of the output of the second delay circuit, and stops rising at a time of transition of a level of the output of the input buffer circuit;

a second voltage generating circuit, connected to the input buffer circuit, for outputting a second analog voltage whose potential level begins to rise at a predetermined gradient at a time of transition of a level of the output of the input buffer circuit;

a voltage comparing/variable delay circuit, connected to the first and second voltage generating circuits, for comparing the first and second analog voltages, outputting an internal clock signal, delaying the internal clock signal, and delivering a delayed output;

an internal circuit connected to the voltage comparing/variable delay circuit, an operation of the internal circuit being controlled in synchronism with the internal clock signal;

a third delay circuit, connected to the voltage comparing/variable delay circuit, for delaying the internal clock signal by a time period that is substantially equal to said first time period, and delivering a delayed output; and a phase comparator, connected to the third delay circuit and the input buffer circuit, for comparing phases of outputs of the third delay circuit and the input buffer circuit, and outputting a control signal corresponding to a phase difference obtained by the comparison of the outputs, wherein a delay time in said voltage comparing/variable delay circuit is adjusted on the basis of the control signal corresponding to the phase difference, which is output from the phase comparator.

22. The sync signal generating circuit according to claim 21, wherein said first time period in the first delay circuit is substantially equal to a sum of a signal delay time of the input buffer circuit relative to the external clock signal and a signal delay time of the internal circuit relative to the internal clock signal.

23. The sync signal generating circuit according to claim 21, wherein said voltage comparing/variable delay circuit comprises:

a charge pump circuit for receiving the control signal and outputting a DC voltage corresponding to the control signal; and a voltage comparing circuit having a power supply node and supplied with the DC voltage output from the charge pump circuit.

24. The sync signal generating circuit according to claim 21, further comprising a control signal output controller circuit, connected to the phase comparator and the voltage comparing/variable delay circuit, for supplying the control signal from the phase comparator to the voltage comparing/variable delay circuit at a predetermined timing.

25. The sync signal generating circuit according to claim 24, wherein said control signal output controller circuit comprises:

a frequency-division circuit, connected to the first delay circuit, for frequency-dividing the external clock signal; and a logic circuit, connected to the frequency-division circuit, the phase comparator and the voltage comparing/variable delay circuit, for obtaining a logic signal based on an output of the frequency-division circuit and the control signal, and supplying the logic signal to the voltage comparing/variable delay circuit.

26. The sync signal generating circuit according to claim 24, wherein said control signal output controller circuit comprises:

an internal clock signal generating circuit; and a logic circuit, connected to the internal clock signal generating circuit and the phase comparator, for obtaining a logic signal based on the internal clock signal and the control signal, and supplying the logic signal to the voltage comparing/variable delay circuit.

27. The sync signal generating circuit according to claim 24, wherein said internal circuit is a DQ buffer circuit, built in a DRAM, for outputting internal data in synchronism with the internal clock signal, and said control signal output controller circuit comprises:

a self-refresh clock signal generating circuit for outputting a refresh clock signal to be used for controlling a self-refresh operation of the DRAM; and a logic circuit, connected to the self-refresh clock signal generating circuit and the phase comparator, for obtaining a logic signal based on the refresh clock signal and the control signal output from the phase comparator, and supplying the logic signal to the voltage comparing/variable delay circuit.

28. A sync signal generating circuit comprising:

an input buffer circuit to which an external clock signal is input;

a first delay circuit, connected to the input buffer circuit, for delaying an output of the input buffer circuit by a first time period and delivering a delayed output;

a second delay circuit, connected to the first delay circuit, for delaying the output of the first delay circuit by a second time period and delivering a delayed output;

a first voltage generating circuit, connected to the second delay circuit and the input buffer circuit, for outputting a first analog voltage whose potential level begins to rise at a predetermined gradient at a time of transition of a level of the output of the second delay circuit, and stops rising at a time of transition of a level of the output of the input buffer circuit;

a second voltage generating circuit, connected to the input buffer circuit, for outputting a second analog voltage whose potential level begins to rise at a predetermined gradient at a time of transition of a level of the output of the input buffer circuit;

a voltage comparing/variable delay circuit, connected to the first and second voltage generating circuits, for comparing the first and second analog voltages, outputting an internal clock signal, delaying the internal clock signal, and delivering a delayed output;

an internal circuit connected to the voltage comparing/variable delay circuit, an operation of the internal circuit being controlled in synchronism with the internal clock signal;

a first frequency-division circuit, connected to the voltage comparing/variable delay circuit, for frequency-dividing the internal clock signal and delivering a frequency-division output;

a third delay circuit, connected to the first frequency-division circuit, for delaying the output of the first frequency-division circuit by a third time period that is substantially equal to said first time period, and delivering a delayed output;

a second frequency-division circuit, connected to the input buffer circuit, for frequency-dividing the output of the input buffer circuit and delivering a frequency-division output; and a phase comparator, connected to the third delay circuit, the second frequency-division circuit and the voltage comparing/variable delay circuit, for comparing phases of outputs of the third delay circuit and the second frequency-division circuit, and outputting a control signal corresponding to a phase difference obtained by the comparison of the outputs to the voltage comparing/variable delay circuit, wherein a delay time in said voltage comparing/variable delay circuit is adjusted on the basis of the control signal output from the phase comparator.

29. The sync signal generating circuit according to claim 28, wherein each of said first time period in the first delay circuit and said third time period in the third delay circuit is substantially equal to a sum of a signal delay time of the input buffer circuit relative to the external clock signal and a signal delay time of the internal circuit relative to the internal clock signal.

30. A sync signal generating circuit comprising:

an input buffer circuit to which an external clock signal is input;

a first delay circuit, connected to the input buffer circuit, for delaying an output of the input buffer circuit by a first time period and delivering a delayed output;

a second delay circuit, connected to the first delay circuit and the input buffer circuit, for starting delaying of the output of the first delay circuit at a time of transition of a level of the output of the first delay circuit and stopping the delaying of the output of the first delay circuit at a time of transition of a level of the output of the input buffer circuit;

a third delay circuit, connected to the input buffer circuit, for starting delaying of the output of the input buffer circuit at a time of transition of a level of the output of the input buffer circuit, delaying the output of the input buffer circuit by a delay time substantially equal to a delay time in the second delay circuit, and outputting a delayed output;

a variable delay circuit, connected to the third delay circuit, for delaying the output of the third delay circuit and outputting an internal clock signal;

an internal circuit connected to the variable delay circuit, an operation of the internal circuit being controlled in synchronism with the internal clock signal;

a fourth delay circuit, connected to the variable delay circuit, for delaying the internal clock signal by a time period that is substantially equal to said first time period, and delivering a delayed output; and a phase comparator, connected to the fourth delay circuit and the input buffer circuit, for comparing phases of outputs of the fourth delay circuit and the input buffer circuit, and outputting to the variable delay circuit a control signal corresponding to a phase difference obtained by the comparison of the outputs, wherein a delay time in said variable delay circuit is adjusted on the basis of the control signal output from the phase comparator.

* * * * *